US012790204B2

(12) United States Patent
Wang et al.

(10) Patent No.: US 12,790,204 B2
(45) Date of Patent: Nov. 10, 2026

(54) PACKAGE STRUCTURE AND METHOD FOR PREPARING SAME, AND SENSOR

(71) Applicants: Beijing BOE Sensor Technology Co., Ltd., Beijing (CN); BOE Technology Group Co., Ltd., Beijing (CN); Beijing BOE Technology Development Co., Ltd., Beijing (CN)

(72) Inventors: Lihui Wang, Beijing (CN); Yue Li, Beijing (CN); Qiuxu Wei, Beijing (CN); Weilong Guo, Beijing (CN); Wenbo Chang, Beijing (CN); Taonan Zhang, Beijing (CN); Jie Sun, Beijing (CN); Nana He, Beijing (CN); Yanfei Ren, Beijing (CN); Feng Qu, Beijing (CN)

(73) Assignees: BEIJING BOE SENSOR TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 290 days.

(21) Appl. No.: 18/766,713

(22) Filed: Jul. 9, 2024

(65) Prior Publication Data

US 2024/0359972 A1 Oct. 31, 2024

Related U.S. Application Data

(63) Continuation of application No. PCT/CN2023/090517, filed on Apr. 25, 2023.

(51) Int. Cl.
*B81B 7/00* (2006.01)

(52) U.S. Cl.
CPC .... *B81B 7/0045* (2013.01); *B81B 2201/0264* (2013.01); *B81B 2207/096* (2013.01); *B81B 2207/11* (2013.01)

(58) Field of Classification Search
CPC .................. B81B 7/007; B81B 7/0045; B81B 2201/0264; B81B 2207/095; B81B 2207/096; B81B 2207/11
See application file for complete search history.

(56) References Cited

U.S. PATENT DOCUMENTS 10,988,374 B2 * 4/2021 Brunner ................ B81B 7/0074
2013/0189483 A1 * 7/2013 Reinmuth ........... B81C 1/00301
428/137

(Continued)

*Primary Examiner* — David C Spalla
(74) *Attorney, Agent, or Firm* — IPro, PLLC

(57) ABSTRACT

Provided is a package structure, including: an insulating dielectric layer having a first surface and a second surface opposite to each other, wherein at least one first accommodation space running from the first surface to the second surface is formed in the insulating dielectric layer; and at least one conductive post in one-to-one correspondence with the at least one first accommodation space, wherein the conductive post is within the corresponding first accommodation space, a material of the conductive post comprises a non-metallic conductive material, and an absolute value of a difference between a thermal expansion coefficient of the conductive post and a thermal expansion coefficient of the insulating dielectric layer is less than or equal to $8\times10^{-6}/^\circ$ C.; wherein the at least one conductive post comprises at least one first conductive post, two end faces of the first conductive post are flush with the first surface and the second surface, respectively.

20 Claims, 19 Drawing Sheets

(56) References Cited

U.S. PATENT DOCUMENTS

| | | | | |
|---|---|---|---|---|
| 2019/0002275 | A1 * | 1/2019 | Chang | B81B 7/007 |
| 2020/0353268 | A1 * | 11/2020 | Yang | A61N 1/3756 |

* cited by examiner

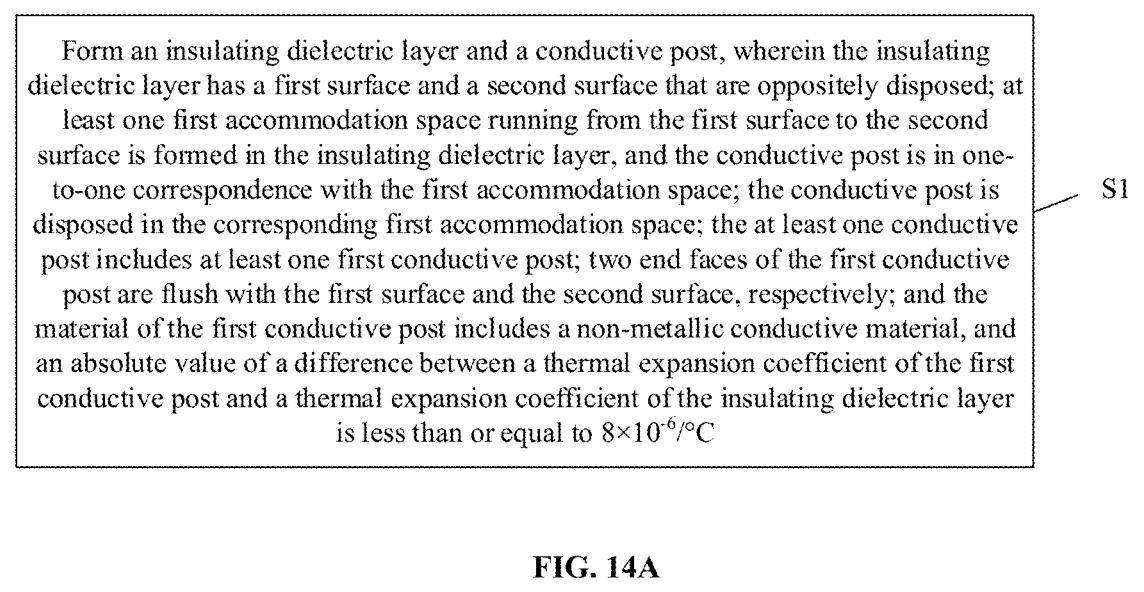

Form an insulating dielectric layer and a conductive post, wherein the insulating dielectric layer has a first surface and a second surface that are oppositely disposed; at least one first accommodation space running from the first surface to the second surface is formed in the insulating dielectric layer, and the conductive post is in one-to-one correspondence with the first accommodation space; the conductive post is disposed in the corresponding first accommodation space; the at least one conductive post includes at least one first conductive post; two end faces of the first conductive post are flush with the first surface and the second surface, respectively; and the material of the first conductive post includes a non-metallic conductive material, and an absolute value of a difference between a thermal expansion coefficient of the first conductive post and a thermal expansion coefficient of the insulating dielectric layer is less than or equal to $8\times10^{-6}$/°C

S1

FIG. 14A

PACKAGE STRUCTURE AND METHOD FOR PREPARING SAME, AND SENSOR

CROSS-REFERENCE TO RELATED APPLICATION

This application is a continuation application of international application No. PCT/CN2023/090517, filed on Apr. 25, 2023, the content of which is herein incorporated by reference in its entirety.

TECHNICAL FIELD

The present disclosure relates to the field of micro electro mechanical system technology, and particularly, relates to a package structure and a method for preparing the same, and a sensor.

BACKGROUND

With the continuous development of semiconductor technology, MSMS chips made by using micro electro mechanical system (MEMS) technology are very impressive. The MSMS chip is generally configured with a package structure, which is an effective way to achieve an I/O interface of the MEMS chip (internal and external interconnections of electrical signals), protection of the internal structure, and environmental interaction and isolation, and to provide a stable and reliable working environment, which is also the key to the transition from laboratory prototypes to products.

SUMMARY

According to some embodiments of the present disclosure, a package structure applied in an MSMS chip is provided. The package structure includes:

an insulating dielectric layer having a first surface and a second surface that are opposite to each other, wherein at least one first accommodation space running from the first surface to the second surface is formed in the insulating dielectric layer; and at least one conductive post in one-to-one correspondence with the at least one first accommodation space, wherein the conductive post is disposed within the corresponding first accommodation space, a material of the conductive post includes: a non-metallic conductive material, and an absolute value of a difference between a thermal expansion coefficient of the conductive post and a thermal expansion coefficient of the insulating dielectric layer is less than or equal to $8\times10^{-6}/°$ C.;

wherein the at least one conductive post includes: at least one first conductive post, two end faces of the first conductive post are flush with the first surface and the second surface, respectively.

In some embodiments, the at least one conductive post further includes a second conductive post, wherein one end face of the second conductive post is flush with the second surface; and the other end face of the second conductive post is flush with the first surface; or the other end face of the second conductive post is disposed between a plane in which the first surface is disposed and a plane in which the second surface is disposed.

In some embodiments, at least one second accommodation space running from the first surface to the second surface is formed in the insulating dielectric layer; and the package structure further includes: a filling post, wherein the filling post is disposed in the corresponding second accommodation space, one end face of the filling post is flush with the second surface, and the other end face of the filling post is disposed between a plane in which the first surface is disposed and a plane in which the second surface is disposed.

In some embodiments, a material of the filling post is the same as the material of the conductive post.

In some embodiments, the package structure further includes:

at least one seal ring disposed on a side of the first surface, wherein an orthographic projection of the conductive post on the first surface is within a region enclosed by an orthographic projection of the corresponding seal ring on the first surface.

In some embodiments, the first conductive post is configured with a corresponding first conductive connection terminal, the first conductive connection terminal being connected to an end face, flush with the first surface, of the corresponding first conductive post; and a thickness of the first conductive connection terminal in a direction perpendicular to the first surface is equal to a thickness of the seal ring in the direction perpendicular to the first surface.

In some embodiments, the first conductive connection terminal and the seal ring are disposed in a same layer and made of a same material.

In some embodiments, a number of the seal rings is two, and the two seal rings are connected to each other at sides close to each other.

In some embodiments, at least one third accommodation space in one-to-one correspondence with the seal ring is formed in the insulating dielectric layer, the third accommodation space being communicated to the first surface; wherein a connection post is provided in the third accommodation space, wherein one end face of the connection post is flush with the first surface, and the end face, flush with the first surface, of the connection post is in contact with the corresponding seal ring.

In some embodiments, the third accommodation space is further communicated to the second surface, and the other end face of the connection post is flush with the second surface.

In some embodiments, a material of the connection post is the same as the material of the conductive post.

In some embodiments, the package structure further includes:

a protective layer 5, disposed on a side of the second surface, wherein at least one via corresponding to the conductive post is formed in the protective layer, the via being communicated to an end face, flush with the second plane, of the conductive post.

In some embodiments, the conductive post is configured with a corresponding second conductive connection terminal, wherein the second conductive connection terminal is disposed within the via corresponding to the corresponding conductive post, and the second conductive connection terminal is connected to the end face, flush with the second surface, of the corresponding conductive post; and a thickness of the second conductive connection terminal in a direction perpendicular to the second surface is greater than a thickness of the protective layer in the direction perpendicular to the second surface.

In some embodiments, wherein a material of the insulating dielectric layer includes glass; and a material of the conductive post includes silicon.

According to some embodiments of the present disclosure, a method for preparing a package structure is provided. The package structure is the package structure as described above. The method includes:

forming an insulating dielectric layer and a conductive post; wherein the insulating dielectric layer has a first surface and a second surface that are oppositely disposed, at least one first accommodation space running from the first surface to the second surface is formed in the insulating dielectric layer, the conductive post is in one-to-one correspondence with the at least one first accommodation space, the conductive post is disposed in the corresponding first accommodation space, and the at least one conductive post includes at least one first conductive post, wherein two end faces of the first conductive post are respectively flush with the first surface and the second surface, a material of the first conductive post includes a non-metallic conductive material, and an absolute value of a difference between a thermal expansion coefficient of the first conductive post and a thermal expansion coefficient of the insulating dielectric layer is less than or equal to $8\times10^{-6}/^{\circ}$ C.

In some embodiments, forming the insulating dielectric layer and the conductive post specifically includes:

providing a non-metallic conductive material substrate, wherein the non-metallic conductive material substrate is divided into a first portion and a second portion that are stacked along a thickness direction;

forming at least one post pattern by performing a patterning process on the first portion, wherein the at least one post pattern includes a preliminary pattern of the at least one first conductive post;

acquiring a combination by fixing an insulating dielectric material sheet to an end, away from the second portion, of the post pattern;

acquiring an original substrate by performing a reflow process on the combination and causing a portion of an insulating dielectric material in the insulating dielectric material sheet to reflow to a side surface of the post pattern; and acquiring a package cover by performing a double-sided polishing process on the original substrate and causing two end faces of the post pattern to be exposed, wherein the insulating dielectric material within the package cover plate serves as the insulating dielectric layer, and the post pattern within the package cover plate includes the first conductive post.

In some embodiments, in forming the at least one post pattern by performing the patterning process on the first portion, the formed at least one post pattern further includes a preliminary pattern of the second conductive post; and the post pattern within the package cover further includes the second conductive post.

In some embodiments, after performing the double-sided polishing process on the original substrate, the method further includes:

etching a portion, close to the first surface, of the second conductive post such that an end face, close to the second surface, of the second conductive post is disposed between a plane in which the first surface is disposed and a plane in which the second surface is disposed.

In some embodiments, in forming the at least one post pattern by performing the patterning process on the first portion, the formed at least one post pattern further includes a preliminary pattern of the filling post 6; and the post pattern within the package cover further includes the filling post.

In some embodiments, after performing the double-sided polishing process on the original substrate, the method further includes:

forming a sealing material film on a side of the first surface; and acquiring a pattern of at least one seal ring by performing a patterning process on the sealing material film, wherein an orthographic projection of the conductive post on the first surface is within a region enclosed by an orthographic projection of the corresponding seal ring on the first surface.

In some embodiments, the first conductive post is configured with a corresponding first conductive connection terminal, the first conductive connection terminal being connected to an end face, flush with the first surface, of the corresponding first conductive post;

the sealing material includes a conductive material; and in performing the patterning process on the sealing material film, the pattern of the seal ring and a pattern of the first conductive connection terminal are acquired simultaneously.

In some embodiments, in forming the at least one post pattern by performing the patterning process on the first portion, the formed at least one post pattern further includes a preliminary pattern of a connection post; and the post pattern within the package cover further includes the connection post, and an end face, flush with the first surface, of the connection post is in contact with the corresponding seal ring.

In some embodiments, the method further includes:

forming a protective layer on a side of the second surface, wherein at least one via corresponding to the conductive post is formed in the protective layer, and the via is communicated to an end face, flush with the second plane, of the corresponding conductive post; and forming a second conductive connection terminal, wherein the second conductive connection terminal is disposed within the via corresponding to the corresponding conductive post, the second conductive connection terminal is connected to an end face, flush with the second plane, of the corresponding conductive post, and a thickness of the second conductive connection terminal in a direction perpendicular to the second surface is greater than a thickness of the protective layer in the direction perpendicular to the second surface.

According to some embodiments of the present disclosure, a sensor is provided. The sensor includes: an MEMS chip and a package structure configured to package the MEMS chip, wherein the package structure is the package structure as described above.

In some embodiments, the MEMS chip includes a pressure-sensitive chip.

In some embodiments, the pressure-sensitive chip includes:

a first substrate, wherein a pressure-sensitive chamber is formed in the first substrate;

a pressure-sensitive film disposed on a side of the first substrate and connected to the pressure-sensitive chamber; and a functional structure for pressure detection, disposed on a side, away from the pressure-sensitive chamber, of the pressure-sensitive film and connected to the pressure-sensitive film.

In some embodiments, the first substrate is divided into a pressure detection region and a pressure reference region; wherein the pressure-sensitive chamber, the pressure-sensitive film, and the functional structure for pressure detection are formed in the pressure detection region; and the functional structure for pressure detection is formed in the pressure reference region and the pressure-sensitive chamber and the pressure-sensitive film are not formed in the pressure reference region.

In some embodiments, the functional structure for pressure detection includes: a piezo-resistor or a capacitor plate.

BRIEF DESCRIPTION OF DRAWINGS

FIG. 14A is a flowchart of a method for preparing a package structure according to some embodiments of the present disclosure;

DETAILED DESCRIPTION

Figure 1:
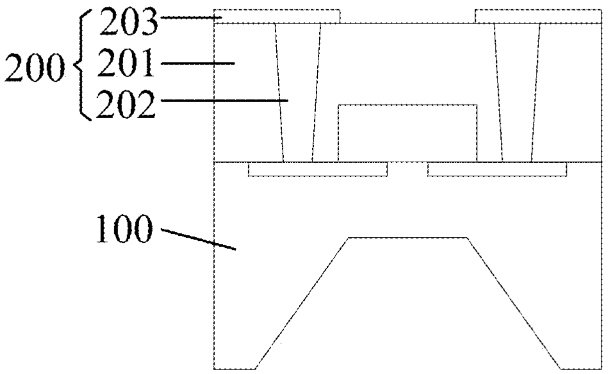
FIG. 1 is a schematic diagram of a cross-section of a sensor in the related art.

The present disclosure is described in further detail with reference to the accompanying drawings, to clearly present the objects, technical solutions, and advantages of the present disclosure.

The present disclosure will be described in greater detail hereinafter with reference to the accompanying drawings. In the various accompanying drawings, the same elements are represented using similar accompanying numerals. For clarity, not all portions of the accompanying drawings are drawn to scale. In addition, certain well-known portions may not be shown in the drawings.

Several particular details of the present disclosure, such as the construction, materials, dimensions, treatment processes, and techniques of the components, are described hereinafter for a clearer understanding of the present disclosure. However, as those skilled in the art can appreciate, the present disclosure may be implemented without following these particular details.

The terms "first," "second," and the like used in the embodiments of the present disclosure do not indicate any order, number, or importance, but are merely used to distinguish between different components. Similarly, terms such as "include" or "comprise" and the like are intended to indicate that the element or object preceding the terms covers the element or object following the terms and its equivalents, and shall not be understood as excluding other elements or objects.

The terms "about" or "approximately" used in the embodiments of the present disclosure indicate that the stated value is within an acceptable range of deviation as determined by those skilled in the art, taking into account the measurements discussed and the errors associated with the measurement of the specific quantity (i.e., the limitations of the measurement system). For example, the term "about" indicates that the difference relative to the stated value is within one or more standard deviations, or ±30%, 20%, 10%, or 5%.

In the presentation of the range M to N in some embodiments of the present disclosure, the limited range includes both M and N endpoint values.

The patterning process in some embodiments of the present disclosure refers to a process that includes photoresist coating, exposure, development, film etching, photoresist stripping, and the like. In performing the film etching process, a matching etching process may be selected based on the film material to be patterned.

In addition, the MEMES chip in the embodiments of the present disclosure may be any MEMS chip, such as a pressure-sensitive MEMS chip, a temperature-sensitive MEMS chip, a light-sensitive MEMS chip, an acoustic wave-sensitive MEMS chip, and the like, which may be not limited herein. The following description is given using a scenario where the MEMS chip is a pressure-sensitive MEMS chip as an example.

FIG. 1 is a schematic diagram of a cross-section of a sensor in the related art. As shown in FIG. 1 the sensor includes an MEMS chip and a package structure 200 configured to package the MEMS chip 100. The package structure 200 includes a glass substrate 201 or a silicon substrate 201. A via is formed in the glass substrate 201 or the silicon substrate 201 by a through glass via (TGV) process or a through silicon via (TSV) process, and then a package cover is acquired by filling the via with a metal material to form a metal post. A plurality of metal electrodes 203 in one-to-one correspondence with the metal posts are formed on a side of the package cover, and each of the metal electrodes 203 is connected to a second end of the corresponding metal post. Considering the electrical conductivity, the metal posts are generally prepared using copper. That is, the metal posts are copper posts 202.

In packaging the MEMS chip 100, a first end of the copper post 202 is bonded and fixed to a functional structure for pressure detection on the MEMS chip 100 by a bonding process, such that the MEMS chip 100 is packaged.

However, in practice, it has been found that the preparation of the package cover composed of the glass substrate 201/silicon substrate 201 and the copper post 202 involved in the related art requires the use of a variety of complex processes such as the TGV/TSV via process, the physical meteorological deposition process of metal materials, the photolithography process, and the electroplating process, and thus the manufacturing process is difficult and costly.

In addition, a high-temperature environment is formed in the process of forming the copper post 202 in the via in the glass substrate 201/silicon substrate 201, and glass (the thermal expansion coefficient is about $7.0\times10^{-6}/°$ C., and the thermal expansion coefficient of high boron glass is about $3.2\times10^{-6}/°$ C.) or silicon (the thermal expansion coefficient is about $2.5\times10^{-6}/°$ C.), which is the material of the substrate 201, has a large difference in the thermal expansion coefficient from that of copper (the thermal expansion coefficient is about $17.5\times10^{-6}/°$ C.), and thus large stress is generated between the copper post 202 and the glass substrate 201/silicon substrate 201 during the production process. As a result, the consistency and stability of the final produced package cover are poor.

To effectively improve at least one of the technical problems existing in the related art, some embodiments of the present disclosure provide a package structure that is applied to an MEMS chip, which is prepared by a simple process and at a low cost, and can also effectively reduce the internal stress of the package structure and improve the consistency and stability of the product.

Figure 2:
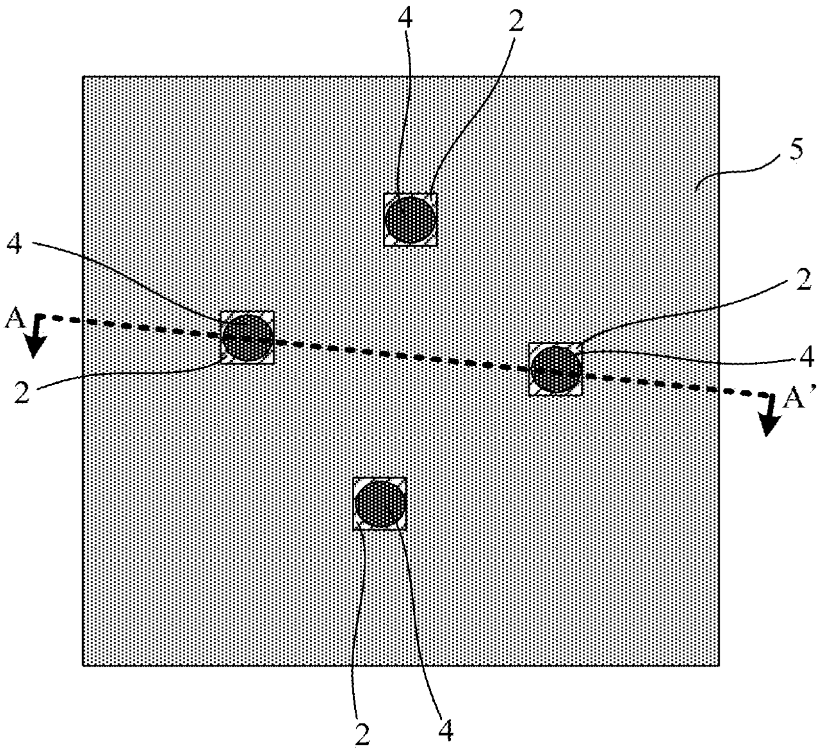
FIG. 2 is a top view of a package structure according to some embodiments of the present disclosure.
Figure 3:
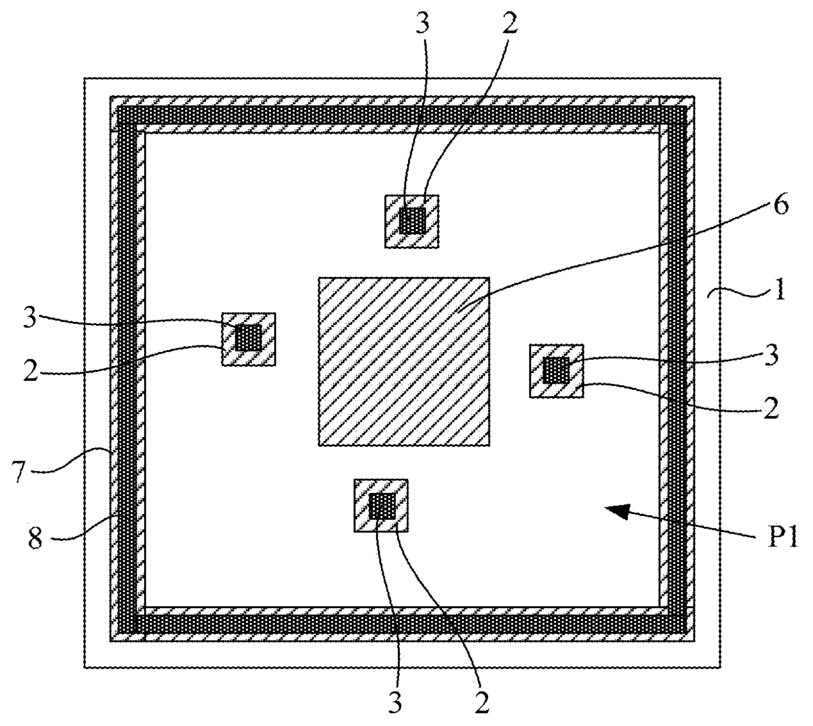
FIG. 3 is a bottom view of a package structure according to some embodiments of the present disclosure.
Figure 4A:
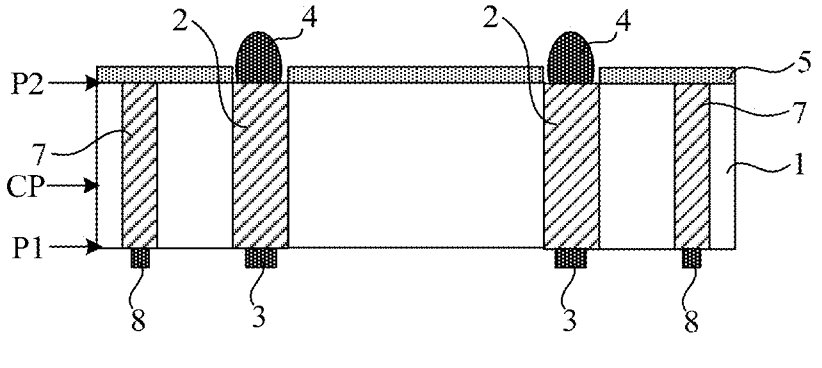
FIG. 4A is a schematic diagram of a cross-section along a direction A-A' in FIG. 2.
Figure 4B:
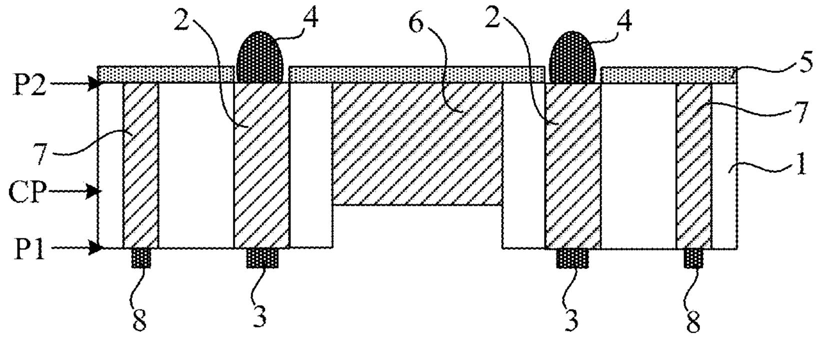
FIG. 4B is a schematic diagram of another cross-section along a direction A-A' in FIG. 2.
Figure 5:
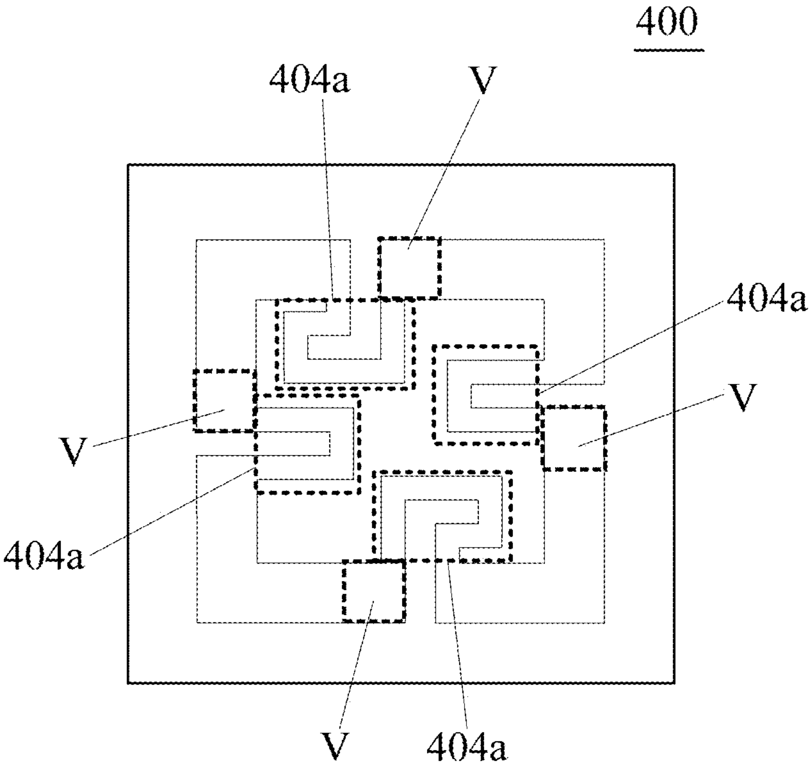
FIG. 5 is a top view of an MEMS chip packaged by the package structure shown in FIG. 2 according to some embodiments of the present disclosure.

FIG. 3 is aa bottom view of a package structure according to some embodiments of the present disclosure. FIG. 4A is a schematic diagram of a cross-section along a direction A-A' in FIG. 2. FIG. 4B is a schematic diagram of another cross-section along a direction A-A' in FIG. 2. FIG. 5 is a top view of an MEMS chip packaged by the package structure shown in FIG. 2 according to some embodiments of the present disclosure. As shown in FIG. 2 to FIG. 5, the package structure includes a package cover CP. The package cover CP includes an insulating dielectric layer 1 and at least one conductive post.

The insulating dielectric layer 1 has a first surface P1 and a second surface P2 that are oppositely disposed, and at least one first accommodation space running from the first surface P1 to the second surface P2 is formed in the insulating dielectric layer.

The conductive posts are in one-to-one correspondence with the first accommodation spaces, and the conductive post is disposed in the corresponding first accommodation space. The material of the conductive post includes a non-metallic conductive material, and an absolute value of a difference between the thermal expansion coefficients of the conductive post and the insulating dielectric layer 1 is less than or equal to $8\times10^{-6}/°$ C. The at least one conductive post includes: at least one first conductive post 2, and two end surfaces of the first conductive post 2 are flush with the first surface P1 and a second surface P2, respectively.

It should be noted that the embodiment in FIG. 1 draws a situation in which four first conductive posts 2 are provided in the package cover CP, which only serves as an exemplary function, and does not construct any limitation to the technical solutions of the present disclosure.

Unlike the related art in which copper post is used as the conductive post, the non-metallic conductive material is used in the embodiments of the present disclosure to prepare the conductive post, and the absolute value of the difference between the thermal expansion coefficients of the conductive post and the insulating dielectric layer 1 is controlled to be less than or equal to $8\times10^{-6}/°$ C. In one aspect, the package cover CP is prepared based on the insulating dielectric material reflow process, such that the difficulty of the preparation process and the cost are reduced. In another aspect, the difference between the thermal expansion coefficients of the conductive post and the insulating dielectric layer 1 in the production process is small, such that the internal stress generated by the high-temperature environment between the two is also small, and thus it is conducive to the consistency and stability of the product. Specific contents are described in detail hereinafter in the corresponding preparation method embodiments.

In some embodiments, the material of the insulating dielectric layer 1 includes glass, and the material of the conductive post includes silicon. In the preparation process, the package cover CP is formed based on a glass reflow process. Because the difference in the thermal expansion coefficients between the glass and the silicon material is small, the internal stress generated between the glass and the silicon during the glass reflow process is also small.

In addition, considering that the conductive post needs to have better electrical conductivity, the material of the conductive post in the embodiments of the present disclosure uses low-resistance silicon with a resistivity ranging about 0.002 Ω·cm to 0.005 Ω·cm.

Referring to FIG. 4B, in some embodiments, at least one second accommodation space running from the first surface P1 to the second surface P2 is formed in the insulating dielectric layer 1, and the package structure further includes a filling post 6. The filling post 6 is disposed in the corresponding second accommodation space, one end face of the filling post 6 is flush with the second surface P2, and the other end face of the filling post 6 is disposed between a plane where the first surface P1 is disposed and a plane in which the second surface P2 is disposed. In some embodiments of the present disclosure, by providing the above filling post 6, and defining one end face of the filling post 6 to be between the plane of the first surface P1 and the plane of the second surface P2, a recess structure. In this case, after the MEMS chip is packaged by the package structure, a distance is present between the MEMS chip and the package cover CP at a position where the filling post 6 is disposed, which provides a certain deformation space for the MEMS chip. This will be described in detail hereinafter in connection with specific examples.

In some embodiments, the material of the filling post 6 is the same as the material of the conductive post. Therefore, the filling post 6 and the conductive post are prepared simultaneously based on the same process, such that the process steps are reduced, the production cycle is shortened, and the production cost is reduced.

In some embodiments, the package structure further includes at least one seal ring 8, disposed on a side of the first surface P1. An orthographic projection of the conductive post on the first surface P1 is within a region enclosed by an orthographic projection of the corresponding seal ring 8 on the first surface P1. In a case where the MEMS chip is packaged using the package structure, in one aspect, the seal ring 8 is capable of fixing the package cover CP to the MEMS chip, and in another aspect, a space between the package cover CP and the MEMS chip is formed into a sealed chamber by the seal ring 8, which prevents the external environment from interfering with the MEMS chip.

In some embodiments, the first conductive post 2 is configured with a corresponding first conductive connection terminal 3, and the first conductive connection terminal 3 is connected to an end face, flush with the first surface P1, of the corresponding first conductive post 2. A thickness of the first conductive connection terminal 3 in a direction perpendicular to the first surface P1 is equal to a thickness of the seal ring 8 in the direction perpendicular to the first surface P1.

In some embodiments, the seal ring 8 is made of a conductive material, and the first conductive connection terminal 3 and the seal ring 8 are disposed in the same layer and made of the same material. Therefore, the seal ring 8 and the first conductive connection terminal 3 are prepared at the same time based on the same process, which is conducive to reducing the number of process steps, shortening the production cycle, and reducing the production cost.

As an example, the seal ring 8 and the first conductive connection terminal 3 are made of metallic materials, such as gold, silver, copper, and the like.

In some embodiments, at least one third accommodation space in one-to-one correspondence with the seal ring 8 is formed in the insulating dielectric layer 1. The third accommodation space is communicated to the first surface P1. A connection post 7 is provided in the third accommodation space. An end face of the connection post 7 is flush with the first surface P1, and the end face, flush with the first surface P1, of the connection post 7 is in contact with the corresponding seal ring 8.

In some embodiments, the bond between the seal ring 8 and the insulating dielectric layer 1 is less strong, and thus the seal ring 8 and the package cover CP are susceptible to separation. For example, in a case where the insulating dielectric layer 1 is made of glass and the seal ring 8 is made of metal, the bonding firmness between the seal ring 8 and the insulating dielectric layer 1 is poor due to the poor bonding firmness between the metal material and the glass. To improve the problem, in some embodiments of the present disclosure, the third accommodation space is formed in the insulating dielectric layer 1, the connection post 7 is provided in the third accommodation space, the material of the connection post 7 is selected to form a firm bond with the seal ring 8, and the seal ring 8 is in contact with the connection post 7 instead of contacting the insulating dielectric layer 1. In this way, the bonding firmness between the seal ring 8 and the package cover CP is greatly improved.

In some embodiments, the third accommodation space is also communicated to the second surface P2, and the other end face of the connection post 7 is flush with the second surface P2.

In some embodiments, the material of the connection post 7 is the same as the material of the conductive post. Therefore, the connection post 7 and the conductive post are prepared simultaneously based on the same process, which is conducive to reducing the process steps, shortening the production cycle, and reducing the production cost. As an example, the materials of the connection post 7 and the conductive post are both silicon, and the material of the seal ring 8 is a metal material, and the bond between the metal material and the silicon material is strong.

In some embodiments, the package structure further includes a protective layer 5 disposed on a side of the second surface P2. At least one via corresponding to the conductive post is formed in the protective layer 5, and the via is communicated to an end face, flush with the second plane, of the corresponding conductive post. The protective layer 5, while exposing at least a portion of the end face flush with the second plane of the conductive post (to facilitate the conduction of signals), is capable of effectively protecting the second surface P2 of the package cover CP, such that the service life of the product is effectively enhanced.

In some embodiments, the conductive post is configured with a corresponding second conductive connection terminal 4. The second conductive connection terminal 4 is disposed in a corresponding via corresponding to the corresponding conductive post, and the second conductive connection terminal 4 is communicated to the end face, flush with the second surface P2, of the corresponding conductive post. A thickness of the second conductive connection terminal 4 in a direction perpendicular to the second surface P2 is greater than a thickness of the protective layer 5 in the direction perpendicular to the second surface P2. That is, the second conductive connection terminal 4 protrudes from a side, away from the package cover CP, of the protective layer 5, such that after acquiring the corresponding sensor by packaging the MEMS chip using the package structure, it is possible to combine the sensor with the driver substrate in a flip-chip manner.

As a specific example, metal solder paste is brushed on the end face, flush with the second surface P2, of each conductive post, and then the above-mentioned second conductive connection terminal 4 is formed by thermal reflow (the material of the terminal includes a metal). When combining the sensor with the driver substrate, the second conductive connection terminal 4 and the corresponding terminal on the driver substrate are flip-chip welded. Compared with the conventional way of mounting the sensor to the driver substrate by using a metal wire, the present disclosure in which the sensor is welded to the driver substrate in a flip-chip manner effectively reduces the package size and the package cost of the sensor.

Referring to FIG. 5, as a specific example, the MEMS chip 400 packaged by the package structure shown in FIG. 2 is a piezo-resistive pressure-sensitive chip, which includes four piezo-resistances 404*a*, and the four piezo-resistances 404*a* together form a Wheatstone bridge. Corresponding to the four piezo-resistances 404*a*, four conductive connection regions V are provided. The four first conductive connection terminals 3 shown in FIG. 2 are connected to the four conductive connection regions V, respectively.

Figure 6:
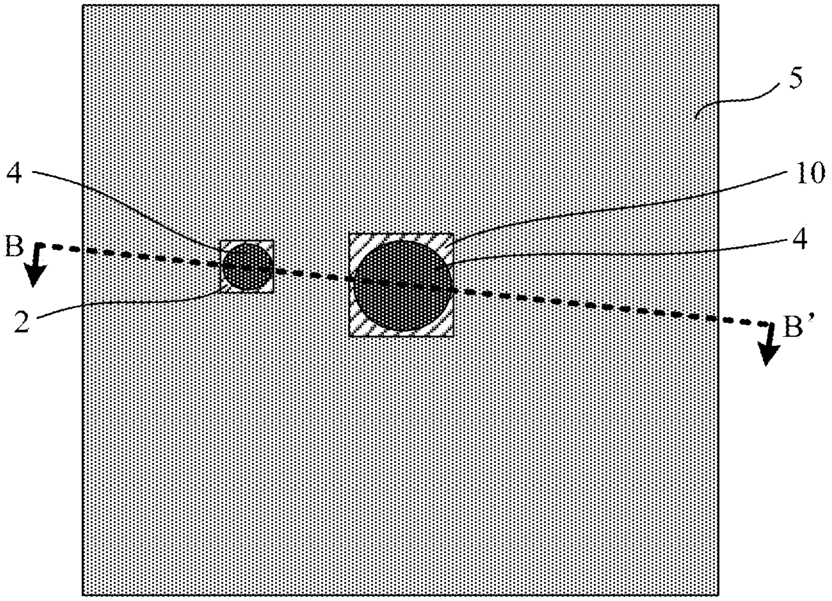
FIG. 6 is another top view of a package structure according to some embodiments of the present disclosure.
Figure 7:
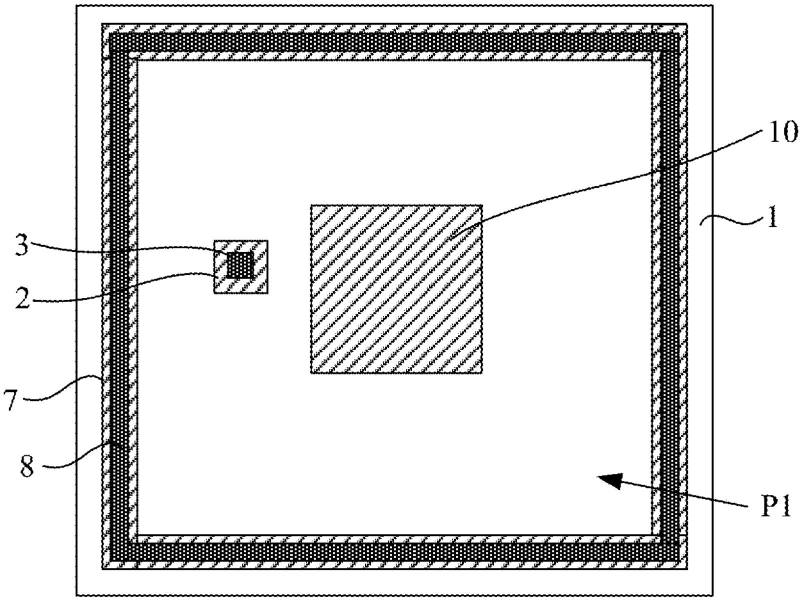
FIG. 7 is another bottom view of a package structure according to some embodiments of the present disclosure.
Figure 8A:
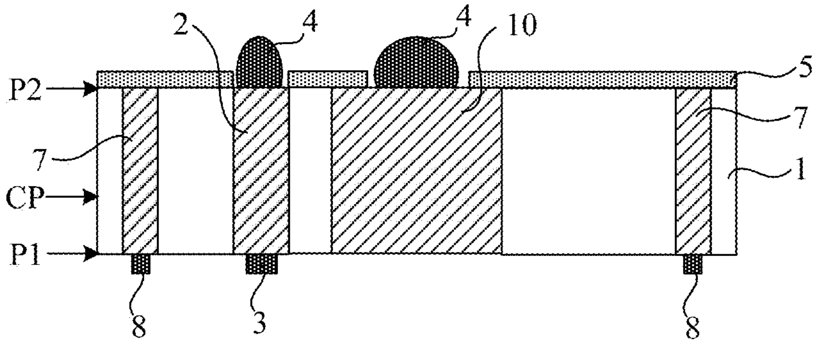
FIG. 8A is a schematic diagram of a cross-section along a direction B-B' in FIG. 6.
Figure 8B:
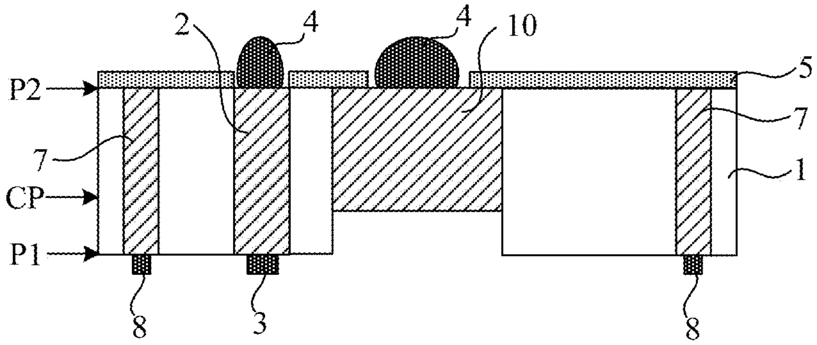
FIG. 8B is a schematic diagram of another cross-section along a direction B-B' in FIG. 6.
Figure 9:
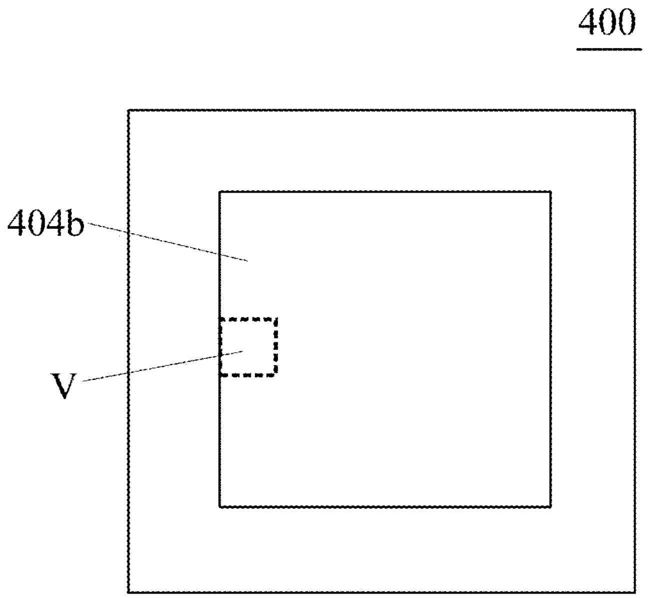
FIG. 9 is a top view of an MEMS chip packaged by the package structure shown in FIG. 6 according to some embodiments of the present disclosure.

FIG. 6 is another top view of a package structure according to some embodiments of the present disclosure. FIG. 7 is another bottom view of a package structure according to some embodiments of the present disclosure. FIG. 8A is a schematic diagram of a cross-section along a direction B-B' in FIG. 6. FIG. 8B is a schematic diagram of another cross-section along a direction B-B' in FIG. 6. FIG. 9 is a top view of an MEMS chip packaged by the package structure shown in FIG. 6 according to some embodiments of the present disclosure. As shown in FIGS. 6 to 9, unlike the previous embodiments, the embodiments shown in FIGS. 6 to 8B include not only the first conductive post 2, but also a second conductive post 10. One end face of the second conductive post 10 is flush with the second surface P2, the other end face of the second conductive post 10 is flush with the first surface P1 (shown in FIG. 8A). Alternatively, the other end face of the second conductive post 10 is disposed between the plane in which the first surface P1 is disposed and the plane in which the second surface P2 is disposed (shown in FIG. 8B).

Unlike the first conductive post 2 which is configured to be electrically connected to the MEMS chip, the second conductive post 10 in the present disclosure is not electrically connected to the MEMS chip, but rather is configured to form a detection capacitance with one of the capacitor plates in the MEMS chip, such that the relevant detection based on detecting the capacitance change is achieved. This will be described in more detail hereinafter in connection with specific examples.

In the embodiments shown in FIGS. 6 to 8B, the package structure also includes at least one of the seal ring 8, the first conductive connection terminal 3, the connection post 7, the protective layer 5, and the second conductive connection terminal 4 described in the previous embodiments. For the specific descriptions of the structures, references are made in the previous embodiments, which are not repeated herein.

Referring to FIG. 9, as a specific example, the MEMS chip 400 packaged by the package structure shown in FIG. 6 is a capacitive pressure-sensitive chip, including one capacitor plate 404*b*. Corresponding to capacitor plate 404*b*, one conductive connection region V is provided. One first conductive connection terminal shown in FIG. 6 is connected to the 1 conductive connection region V.

Figure 10:
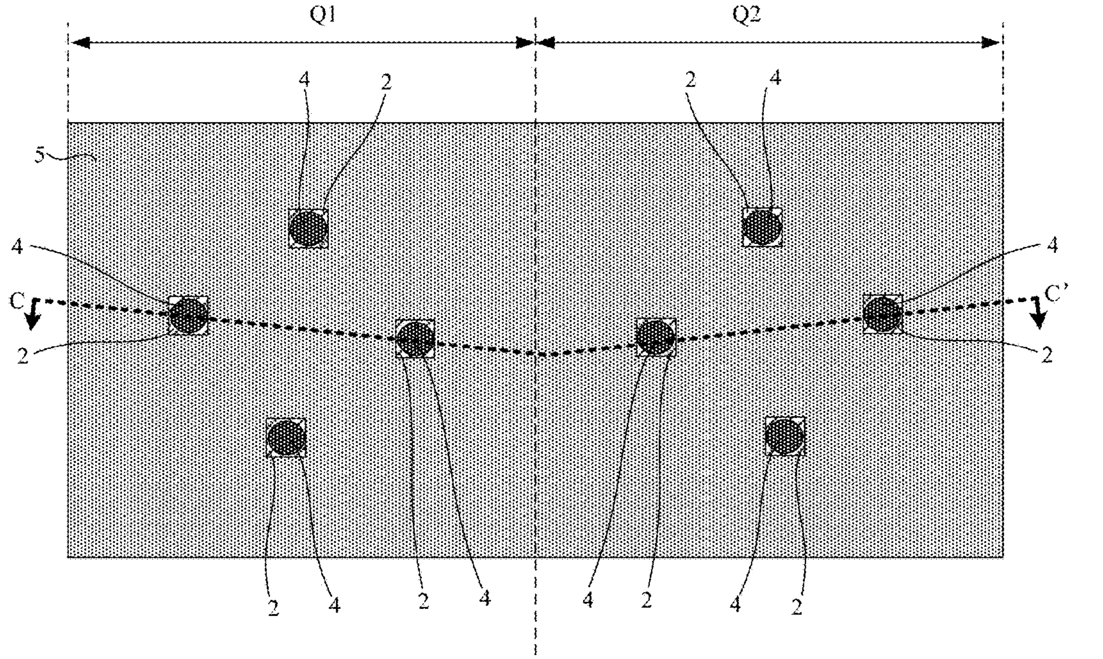
FIG. 10 is yet another top view of a package structure according to some embodiments of the present disclosure.
Figure 11:
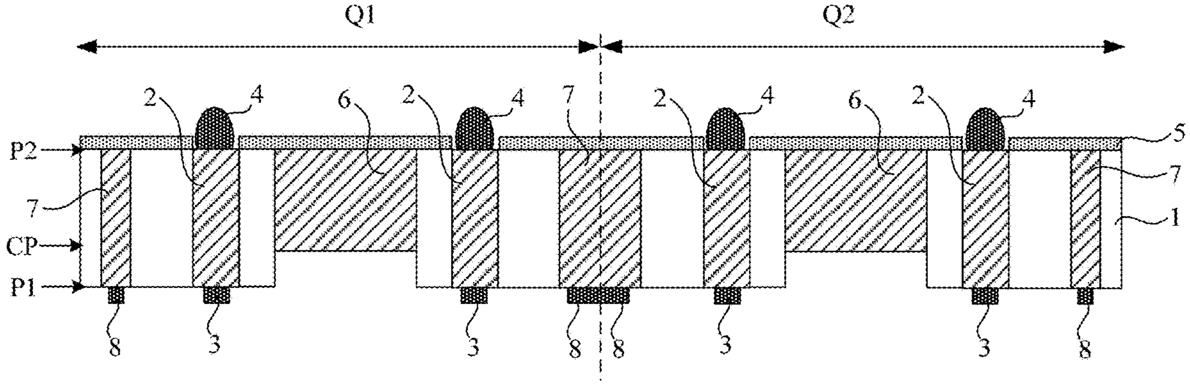
FIG. 11 is a schematic diagram of a cross-section along a direction C-C' in FIG. 10.
Figure 12:
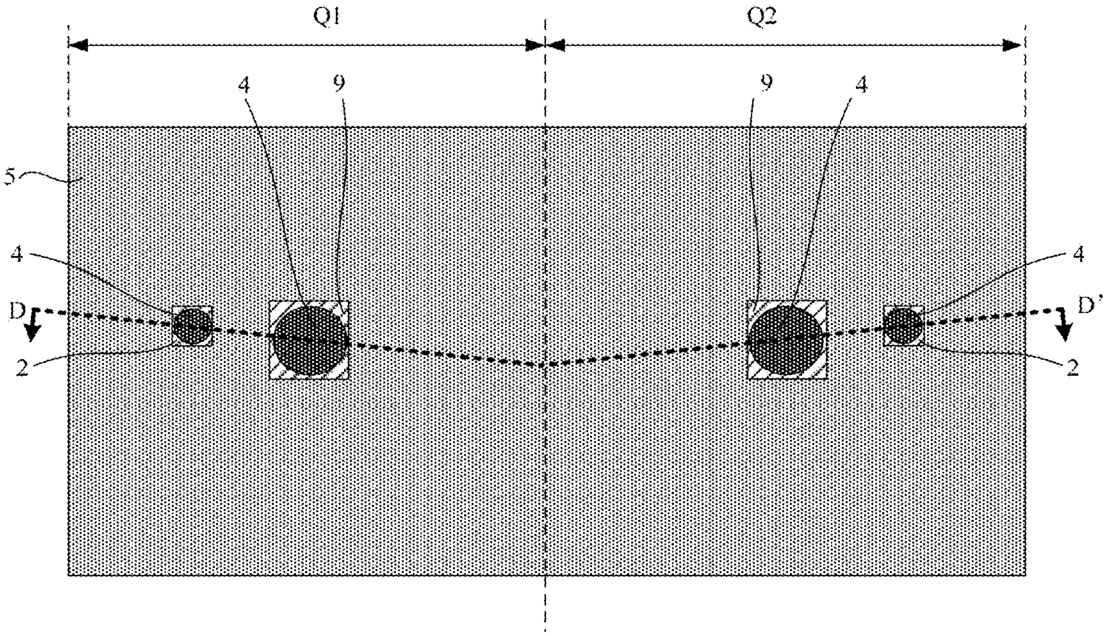
FIG. 12 is yet another top view of a package structure according to some embodiments of the present disclosure.
Figure 13:
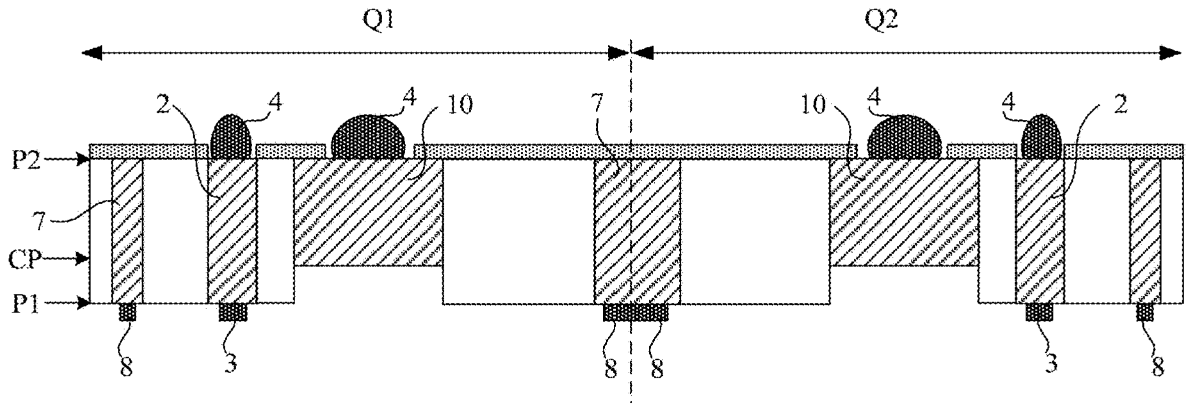
FIG. 13 is a schematic diagram of a cross-section along a direction D-D' in FIG. 12.

FIG. 10 is yet another top view of a package structure according to some embodiments of the present disclosure. FIG. 11 is a schematic diagram of a cross-section along a direction C-C' in FIG. 10. FIG. 12 is yet another top view of a package structure according to some embodiments of the present disclosure. FIG. 13 is a schematic diagram of a cross-section along a direction D-D' in FIG. 12. As shown in FIGS. 10 to 13, in some embodiments, the entire package structure includes two package regions Q1, Q2 (each of the package regions Q1, Q2 is configured to package a single MEMS chip), and each of the package regions Q1, Q2 corresponds to one seal ring 8. That is, the package structure includes two seal rings 8 therein. In some embodiments, the two seal rings 8 are joined together at sides close to each other.

It should be known to those skilled in the art that the number of package regions Q1, Q2 of the package structure in the embodiments of the present disclosure is three, four, or even more. Accordingly, the number of seal rings 8 is 3, 4, or even more. In a case where the number of seal rings 8 is greater than or equal to 2, whether the different seal rings 8 are in contact with each other is not limited herein.

Based on the same inventive concept, some embodiments of the present disclosure also provide a method for preparing a package structure, which is applicable to preparing the package structure described in the previous embodiments. FIG. 14A is a flowchart of a method for preparing a package structure according to some embodiments of the present disclosure. As shown in FIG. 14A, the method includes the following steps.

In step S1, an insulating dielectric layer and a conductive post are formed. The insulating dielectric layer has a first surface and a second surface that are oppositely disposed. At least one first accommodation space running from the first surface to the second surface is formed in the insulating dielectric layer, and the conductive post is in one-to-one correspondence with the first accommodation space. The conductive post is disposed in the corresponding first accommodation space. The at least one conductive post includes at least one first conductive post. Two end faces of the first conductive post are flush with the first surface and the second surface, respectively. The material of the first conductive post includes a non-metallic conductive material, and an absolute value of a difference between a thermal expansion coefficient of the first conductive post and a thermal expansion coefficient of the insulating dielectric layer is less than or equal to $8\times10^{-6}/^{\circ}$ C.

Figure 14B:
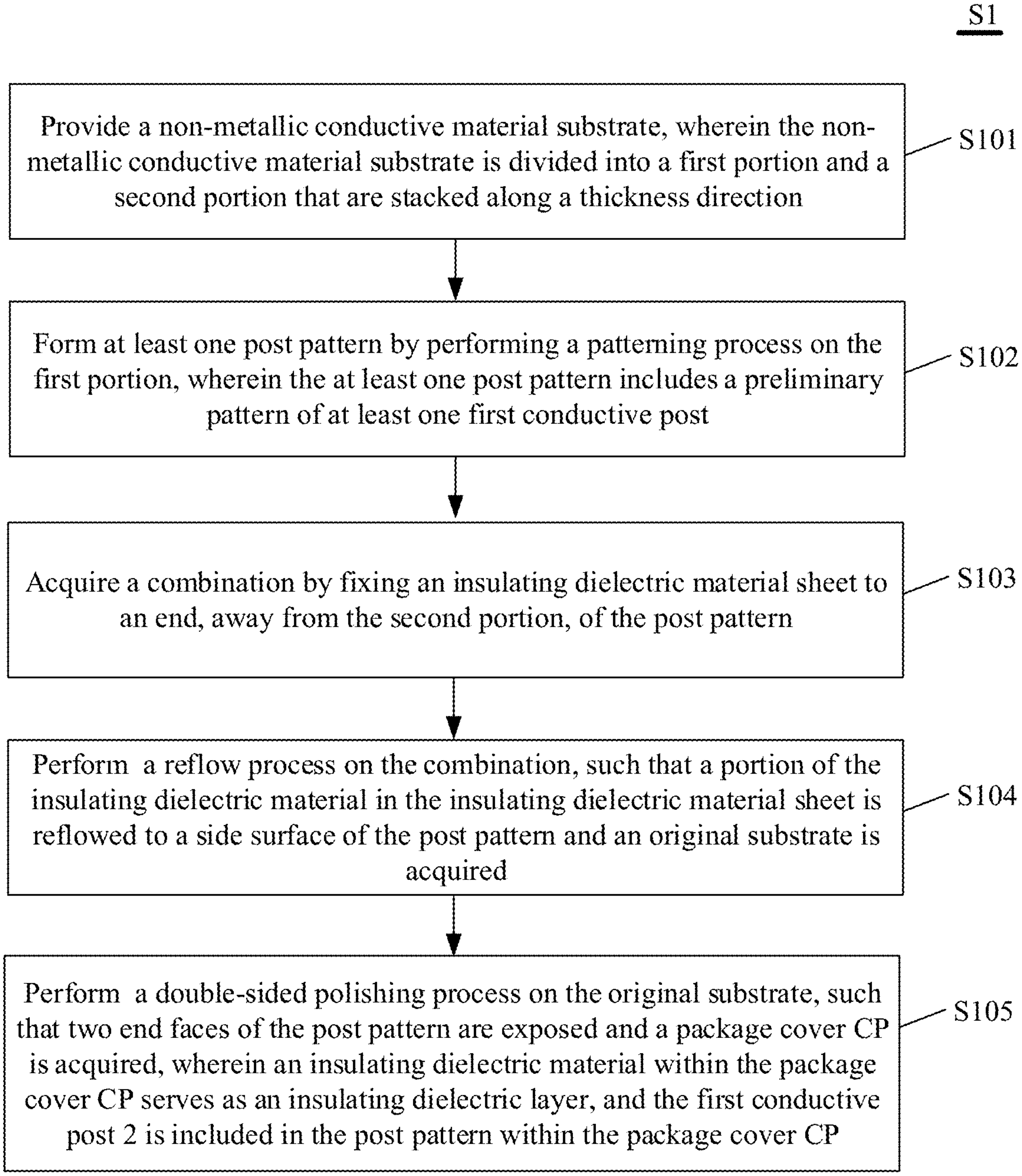
FIG. 14B is a flowchart of a method for forming an insulating dielectric layer and a conductive post based on a reflow process according to some embodiments of the present disclosure.
Figure 15:
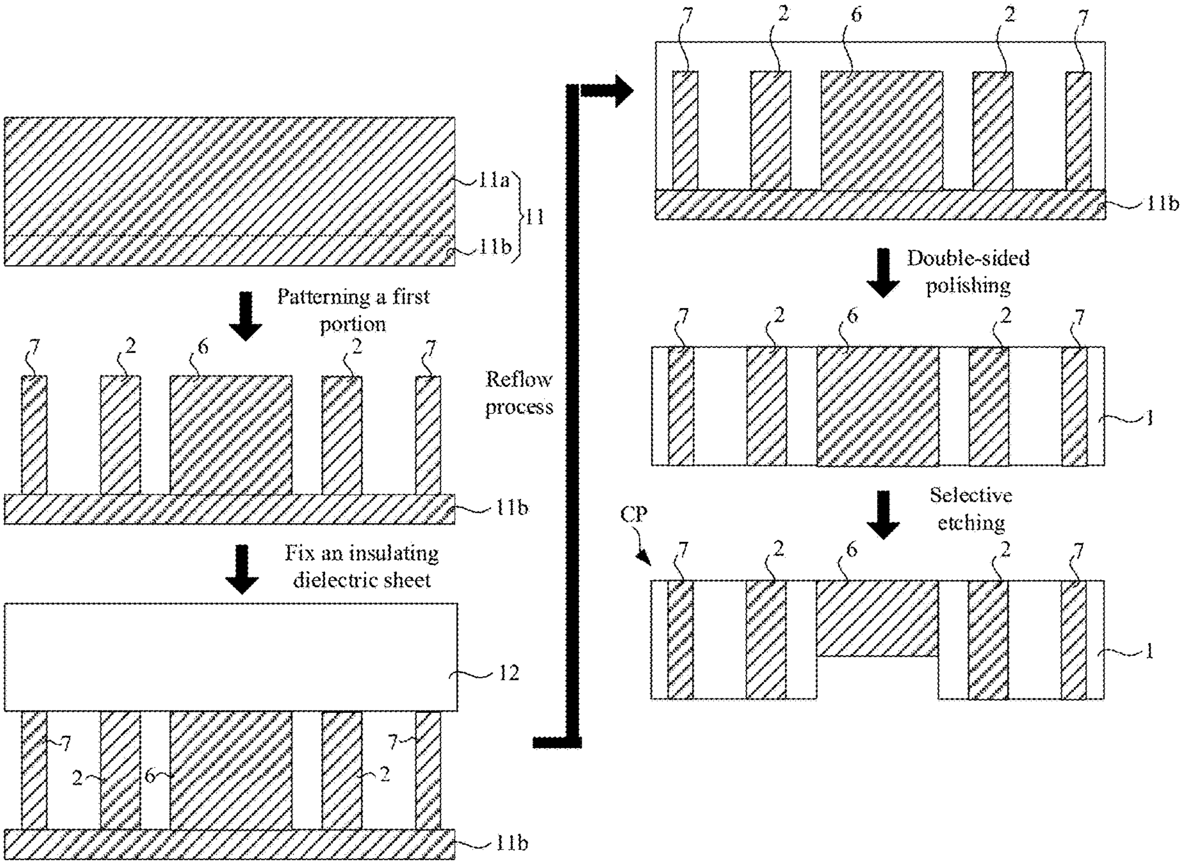
FIG. 15 is a schematic structural diagram of a process flow corresponding to the method shown in FIG. 14B.
Figure 16:
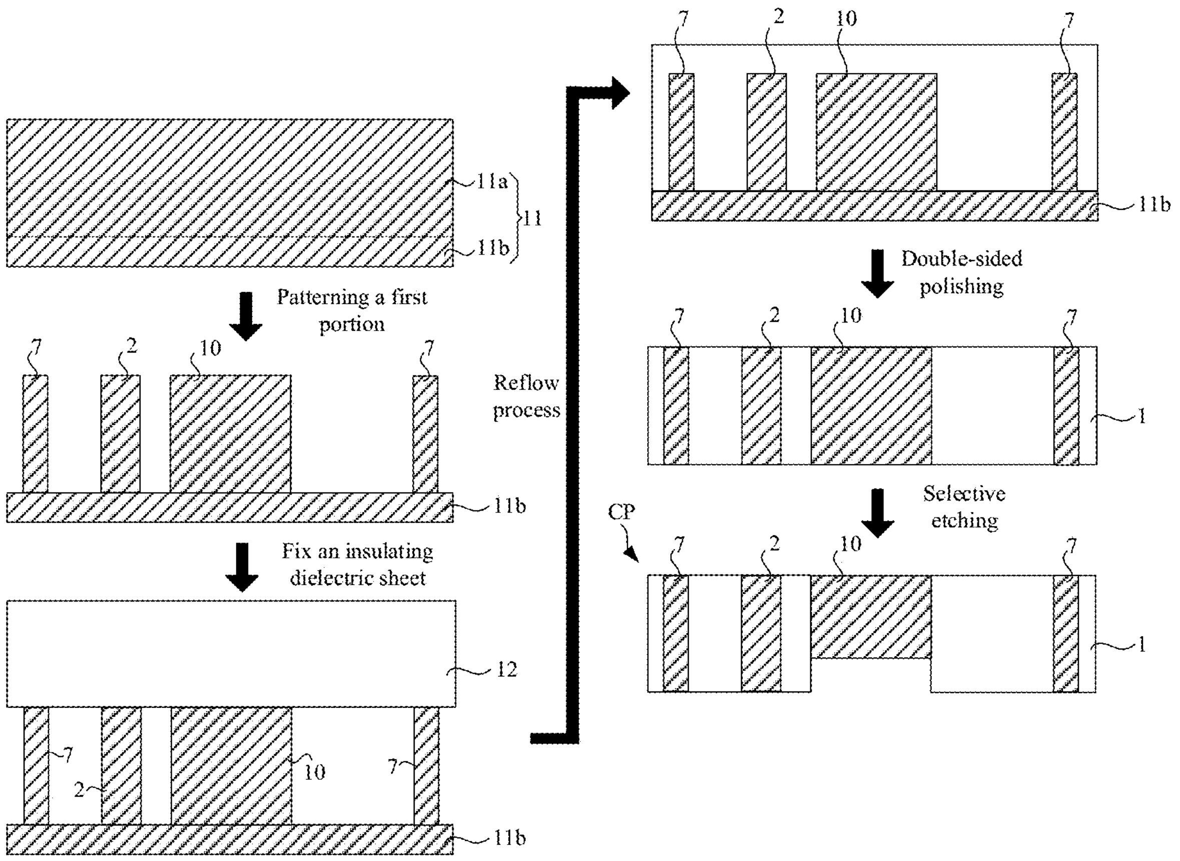
FIG. 16 is a schematic structural diagram of another process flow corresponding to the method shown in FIG. 14B.

FIG. 14B is a flowchart of a method for forming an insulating dielectric layer and a conductive post based on a reflow process according to some embodiments of the present disclosure. FIG. 15 is a schematic structural diagram of a process flow corresponding to the method shown in FIG. 14B. FIG. 16 is a schematic structural diagram of another process flow corresponding to the method shown in FIG. 14B. As shown in FIGS. 14B to 16, step S1 includes the following sub-steps.

In step S101, a non-metallic conductive material substrate is provided. The non-metallic conductive material substrate is divided into a first portion and a second portion that are stacked along a thickness direction.

As an example, the non-metallic conductive material substrate is a silicon substrate 11, and a thickness of the non-metallic conductive material substrate 11, and a thicknesses of each of the first portion 11*a* and the second portion 11*b* are pre-determined according to actual needs.

In step S102, at least one post pattern is formed by performing a patterning process on the first portion. The at least one post pattern includes a preliminary pattern of at least one first conductive post.

During the patterning process of the first portion 11*a*, a deep reactive ion etching (DRIE) process is used to etch the first portion 11*a* of the silicon substrate, and an etching depth is controlled by an etching duration to ensure that the second portion 11*b* is not patterned.

In step S102, the number of formed post patterns and the shape of each post pattern are pre-designed according to practical needs.

The process flow shown in FIG. 15 corresponds to preparing the package cover CP shown in FIG. 4B, and the process flow shown in FIG. 16 corresponds to preparing the package cover CP shown in FIG. 8B.

Referring to FIG. 15, in some embodiments, the at least one post pattern acquired by step S102 also includes a preliminary pattern of the filling post 6.

Referring to FIG. 16, in some embodiments, the at least one post pattern acquired by step S102 also includes a preliminary pattern of the second conductive post 10.

Referring to FIGS. 15 and 16, in some embodiments, the at least one post pattern acquired by step S102 also includes a preliminary pattern of the connection post 7.

In step S103, a combination is acquired by fixing an insulating dielectric material sheet to an end, away from the second portion, of the post pattern.

In some embodiments, the insulating dielectric material sheet 12 is a glass sheet. The glass sheet is bonded and fixed to the end, away from the second portion 11*b*, of at least a portion of the post pattern acquired in step 102.

In step S104, the combination is subjected to a reflow process, such that a portion of the insulating dielectric material in the insulating dielectric material sheet is reflowed to a side surface of the post pattern and an original substrate is acquired.

In performing the reflow process, a heating temperature should be higher than a melting point of the insulating dielectric material sheet and lower than a melting point of the non-metallic conductive material.

In some embodiments, the molten glass is reflowed to the side surface of the post (essentially silicon post) pattern by the glass reflow process, the original substrate is acquired upon cooling.

In step S105, the original substrate is subjected to a double-sided polishing process, such that two end faces of the post pattern are exposed and a package cover CP is acquired. An insulating dielectric material within the package cover CP serves as an insulating dielectric layer, and the first conductive post 2 is included in the post pattern within the package cover CP.

In step S105, a chemical mechanical polishing (CMP) process is used to polish both sides of the original substrate acquired in step S104, such that the two end surfaces of the post pattern are exposed, and thus the package cover CP is acquired.

Referring to FIG. 15, in a case where the preliminary pattern of the filling post 6 is included in the at least one post pattern acquired in step S102, the package cover CP acquired in step S105 includes the filling post 6.

In some embodiments, after step S105 ends, a portion, close to the first surface P1, of the filling post 6 is etched such that an end face, close to the second surface P2, of the filling post 6 is disposed between a plane where the first surface P1 is disposed and a plane where the second surface P2 is disposed.

Referring to FIG. 16, in a case where the preliminary pattern of the second conductive post 10 is included in the at least one post pattern acquired in step S102, the package cover CP acquired in step S105 includes the second conductive post 10.

In some embodiments, after step S105 ends, a portion, close to the first surface P1, of the second conductive post 10 is etched such that an end face, close to the second surface P2, of the second conductive post 10 is disposed between the plane where the first surface P1 is disposed and the plane where the second surface P2 is disposed.

Figure 17:
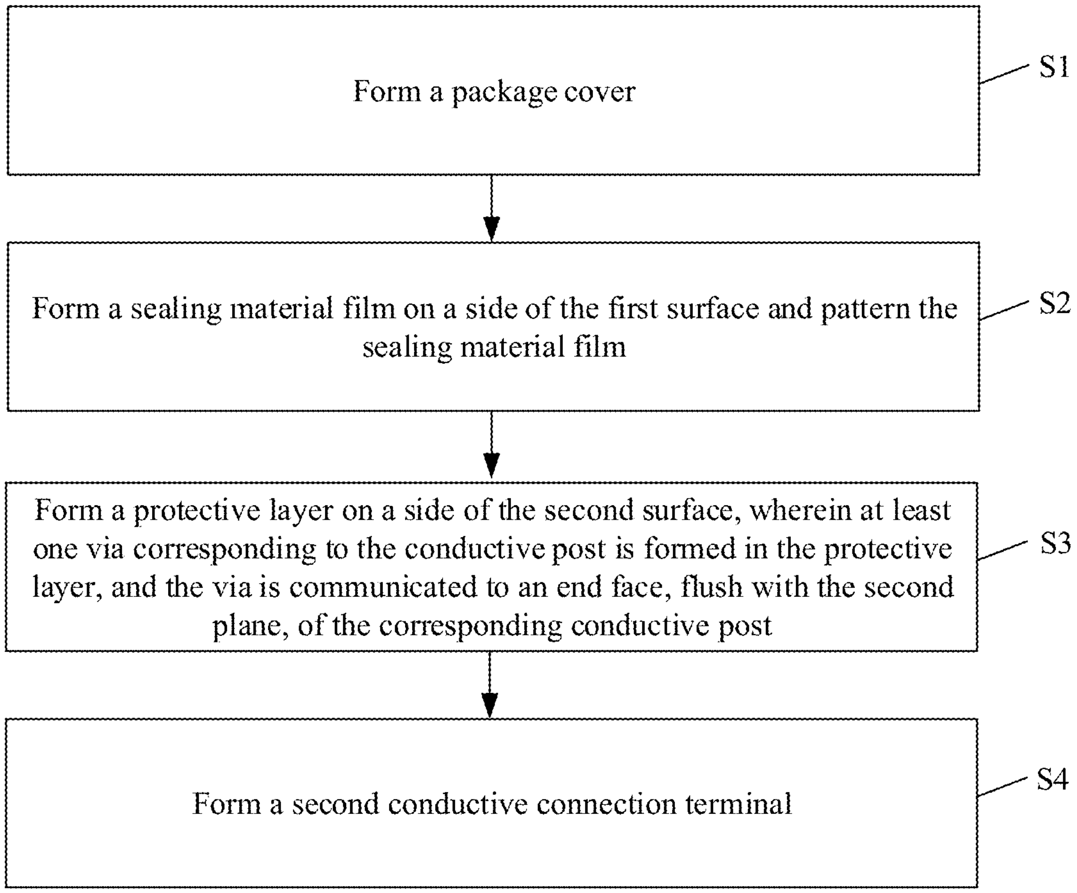
FIG. 17 is a flowchart of yet another method for preparing a package structure according to some embodiments of the present disclosure.
Figure 18:
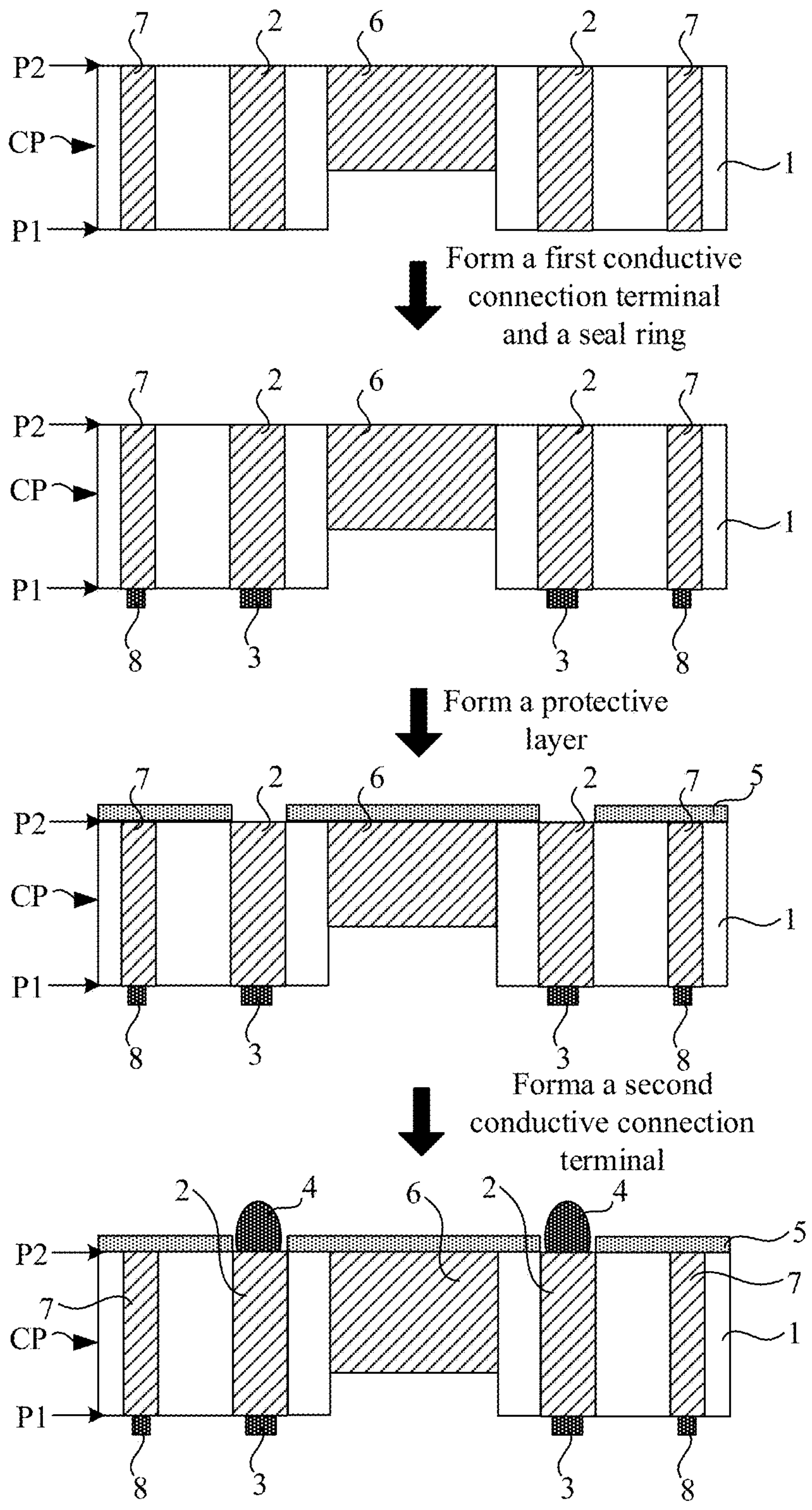
FIG. 18 is a schematic structural diagram of a process flow corresponding to the method shown in FIG. 17.
Figure 19:
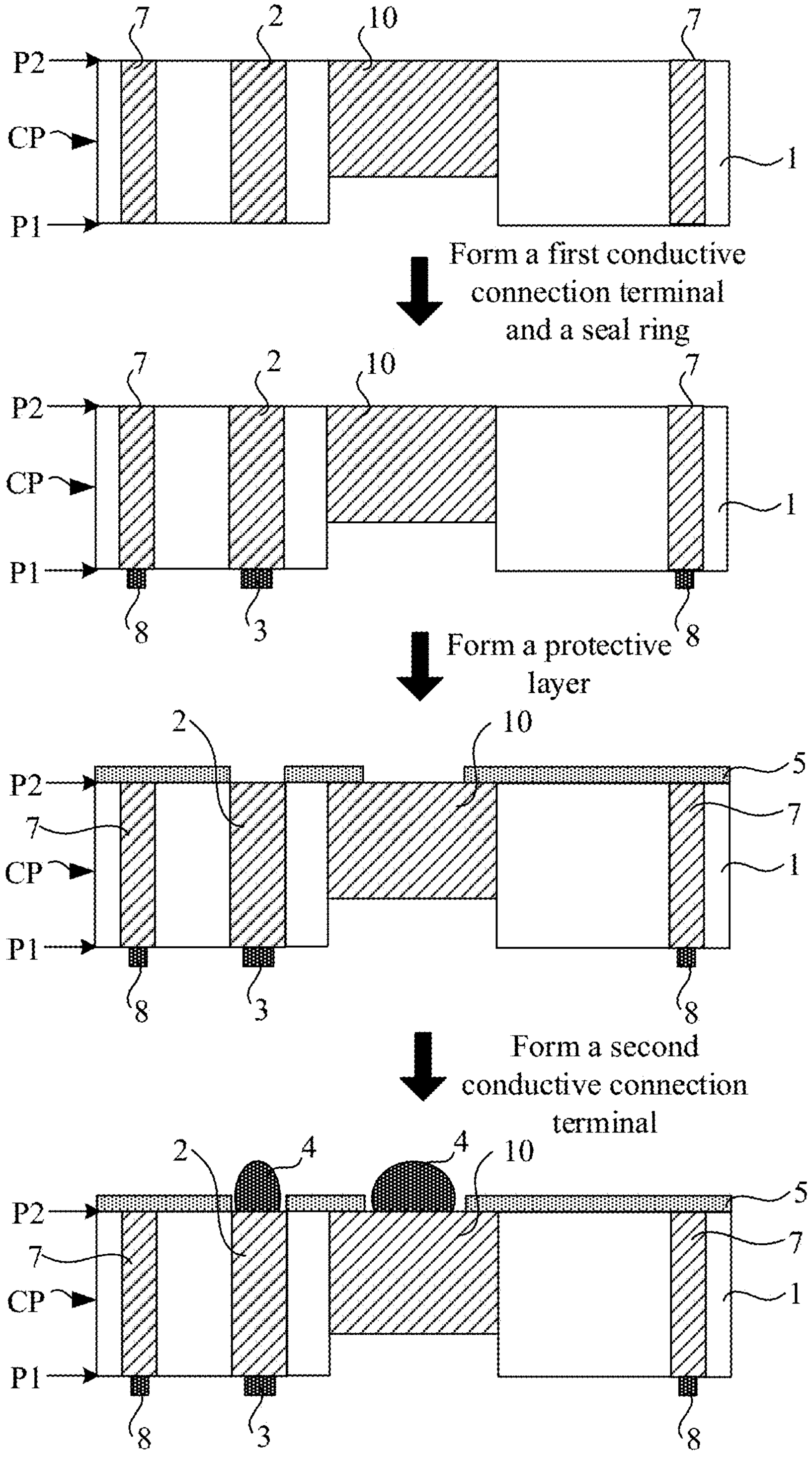
FIG. 19 is a schematic structural diagram of another process flow corresponding to the method shown in FIG. 17.

FIG. 17 is a flowchart of yet another method for preparing a package structure according to some embodiments of the present disclosure. FIG. 18 is a schematic structural diagram of a process flow corresponding to the method shown in FIG. 17. FIG. 19 is a schematic structural diagram of another process flow corresponding to the method shown in FIG. 17. As shown in FIGS. 17 to 19, the process flow shown in FIG. 18 corresponds to preparing the package structure shown in FIG. 4B, and the process flow shown in FIG. 19 corresponds to preparing the package cover CP shown in FIG. 8B. The method includes the following steps.

In step S1, a package cover is formed.

For the specific description of step S1, reference is made to the previous relevant descriptions of FIGS. 14A to 16, which is not repeated herein.

In step S2, a sealing material film is formed on a side of the first surface and the sealing material film is patterned.

In step S2, a pattern of the seal ring 8 is at least acquired by the patterning process, and an orthographic projection of the conductive post on the first surface P1 is within a region enclosed by an orthographic projection of the corresponding seal ring 8 on the first surface P1.

The first conductive post 2 is configured with a corresponding first conductive connection terminal 3. The first conductive connection terminal 3 is connected to an end face, flush with the first surface P1, of the corresponding first conductive post 2, and the sealing material includes a conductive material, e.g. a metallic material.

In some embodiments, after patterning the sealing material film, a pattern of the first conductive connection terminal 3 is acquired along with the pattern of the seal ring 8. That is, the first conductive connection terminal 3 and the seal ring 8 are acquired based on the same patterning process.

In step S3, a protective layer is formed on a side of the second surface. At least one via corresponding to the conductive post is formed in the protective layer. The via is communicated to an end face, flush with the second plane, of the corresponding conductive post.

In step S3, a protective material film is first formed on the second surface P2, and then the protective material film is patterned, such that a pattern of the protective layer 5 is acquired. The protective material is at least one of silicon oxide or silicon nitride.

In step S4, a second conductive connection terminal is formed.

The second conductive connection terminal 4 is disposed in the via corresponding to the corresponding conductive post, and the second conductive connection terminal 4 is connected to an end face, flush with the second surface P2, of the corresponding conductive post. A thickness of the second conductive connection terminal 4 in a direction perpendicular to the second surface P2 is greater than a thickness of the protective layer 5 in the direction perpendicular to the second surface P2. The second conductive connection terminal 4 is capable of writing an electrical signal provided by an external unit to the corresponding conductive post, or transmitting an electrical signal provided by the conductive post to an external unit.

Figure 20:
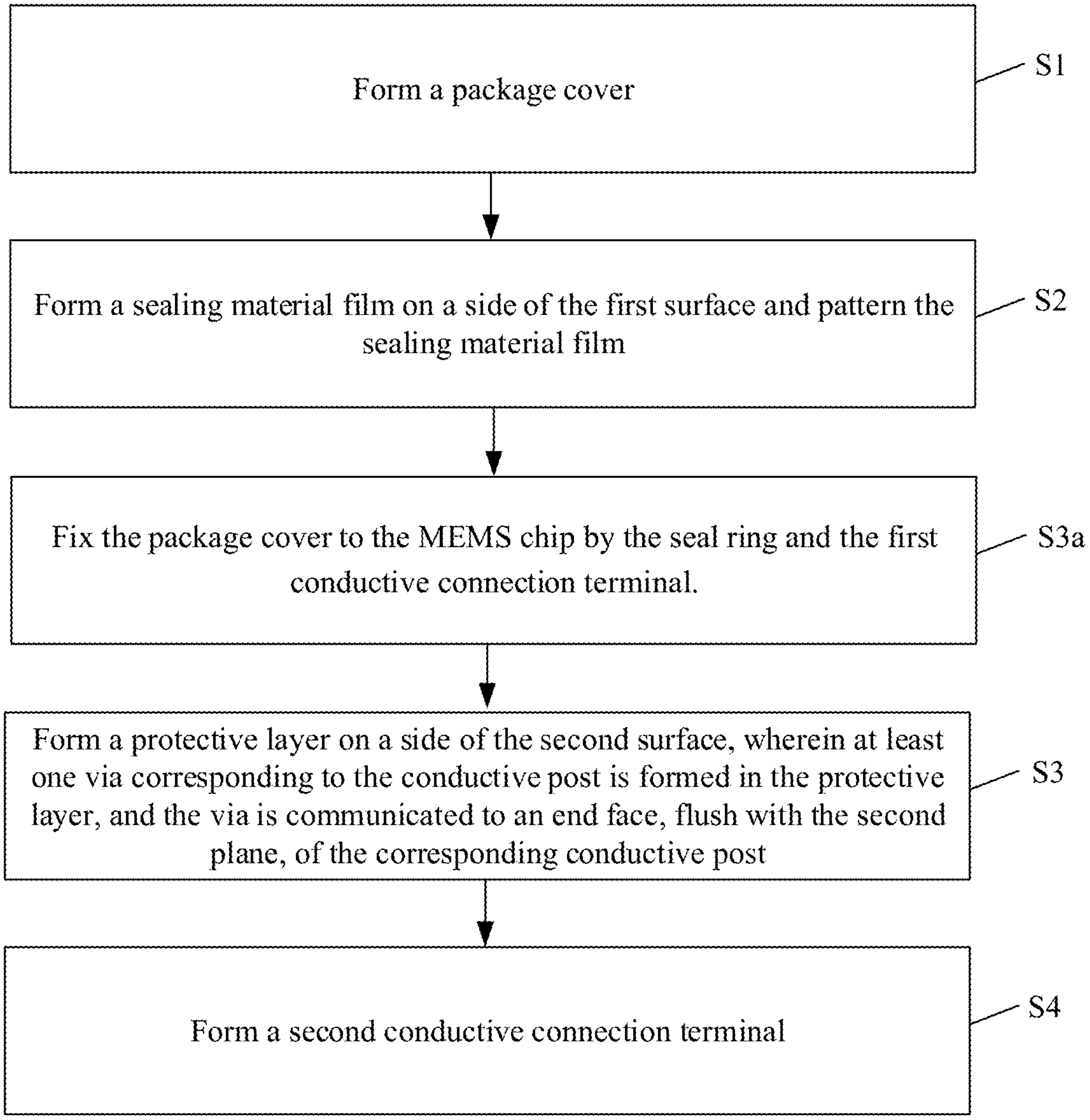
FIG. 20 is a flowchart of yet another method for preparing a package structure according to some embodiments of the present disclosure.
Figure 21:
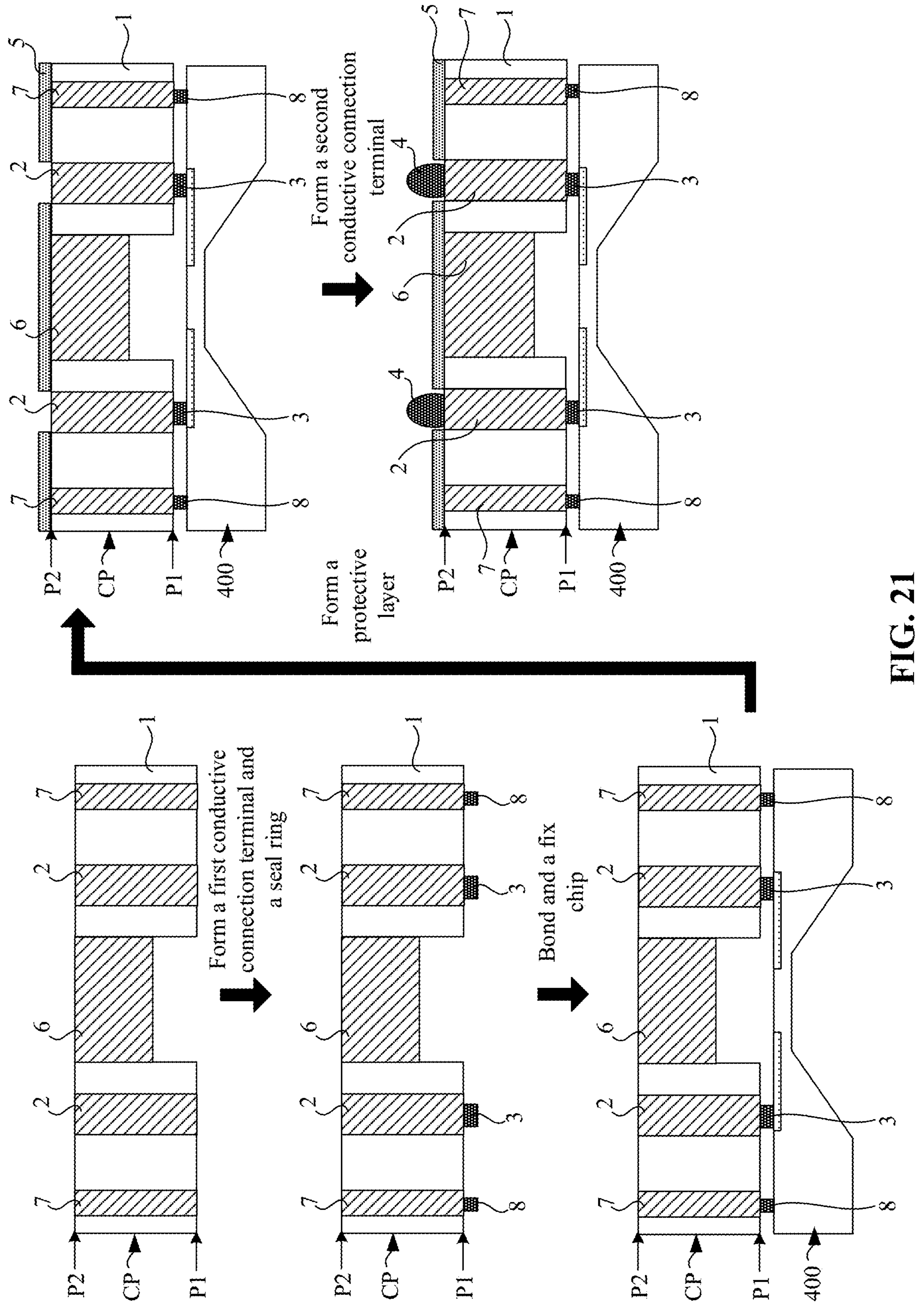
FIG. 21 is a schematic structural diagram of a process flow corresponding to the method shown in FIG. 20.
Figure 22:
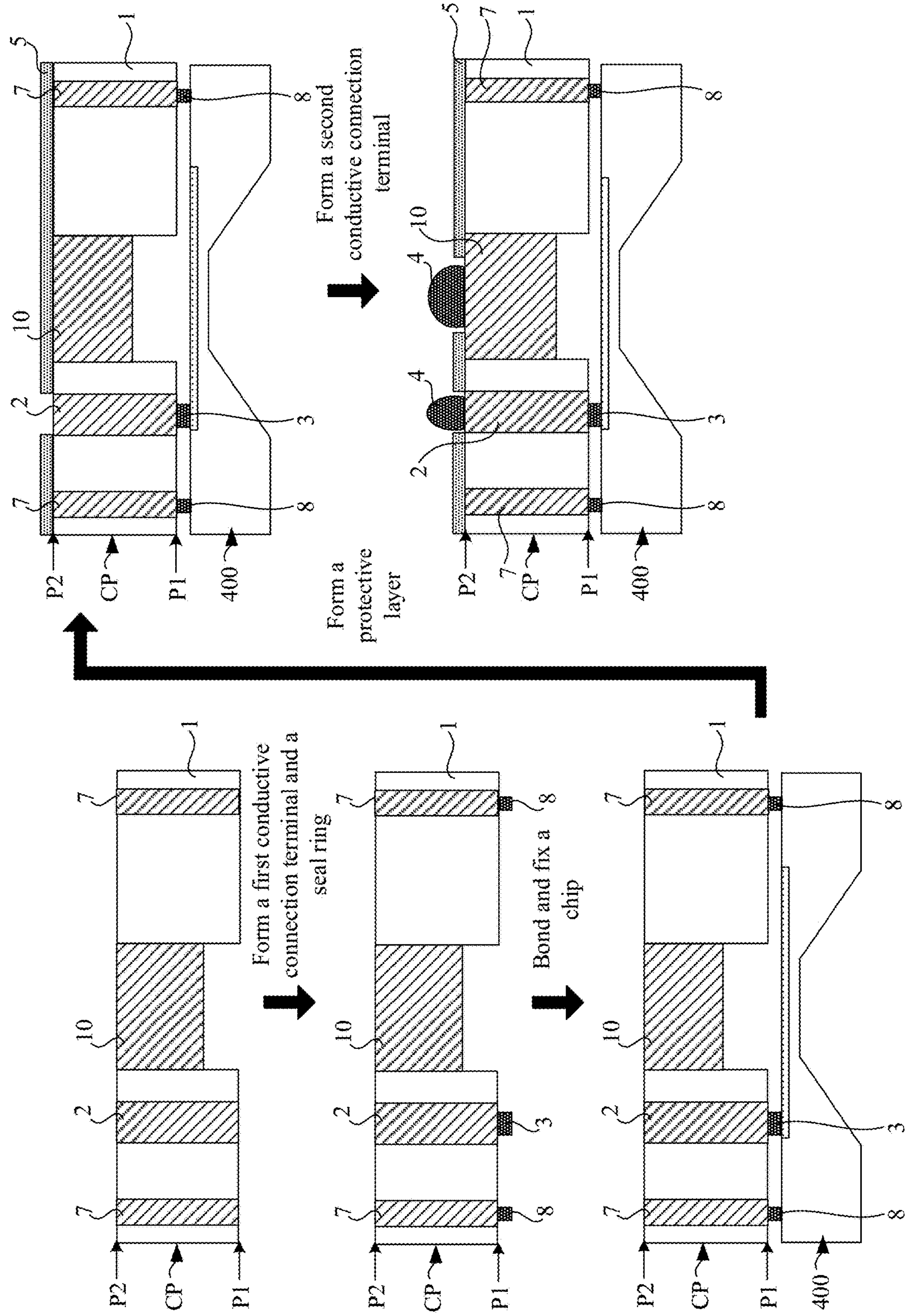
FIG. 22 is a schematic structural diagram of another process flow corresponding to the method shown in FIG. 20.

FIG. 20 is a flowchart of yet another method for preparing a package structure according to some embodiments of the present disclosure. FIG. 21 is a schematic structural diagram of a process flow corresponding to the method shown in FIG. 20. FIG. 22 is a schematic structural diagram of another process flow corresponding to the method shown in FIG. 20. As shown in FIGS. 20 to 22, the method not only includes step S1 to step S4 in FIG. 17, but also includes step S3*a* between step S3 and step S3*a*. Only step S3*a* is described in detail hereinafter.

In step S3*a*, the package cover is fixed to the MEMS chip by the seal ring and the first conductive connection terminal.

That is, prior to forming the protective layer 5 on the package cover CP, the package cover CP and the MEMS chip 400 are packaged and fixed. In step S3*a*, the seal ring 8 and the first conductive connection terminal 3 are bonded and fixed on the corresponding positions on the MEMS chip 400 by using a bonding process.

The first conductive connection terminal 3 is capable of transmitting electrical signals from the MEMS chip to the corresponding first conductive post 2 for collection by the external unit, or transmitting electrical signals written by the external unit to the first conductive post 2 to the MEMS chip 400.

Based on the same inventive concept, some embodiments of the present disclosure also provide a sensor. The sensor includes an MEMS chip and a package structure configured to package the MEMS chi. The package structure adopts a package structure as described above. For a specific description of package structure, reference is made to the contents of the preceding embodiments, which is not repeated herein.

Figure 23:
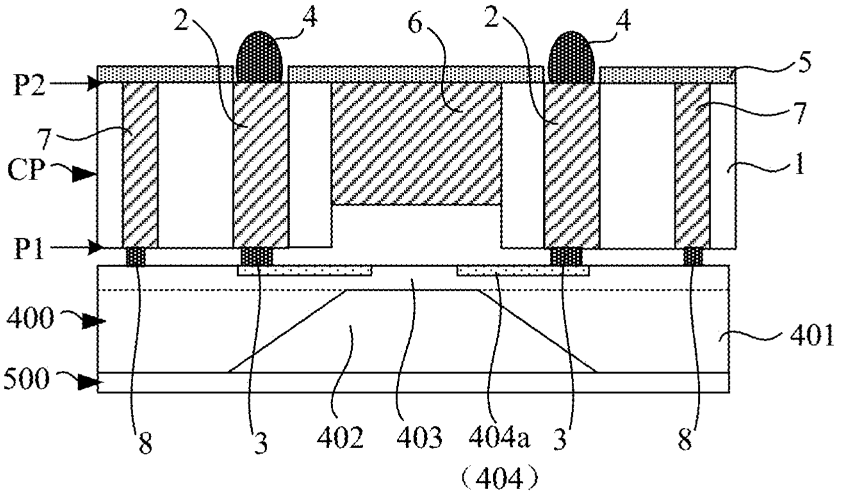
FIG. 23 is a schematic diagram of a cross-section of a sensor according to some embodiments of the present disclosure.
Figure 24:
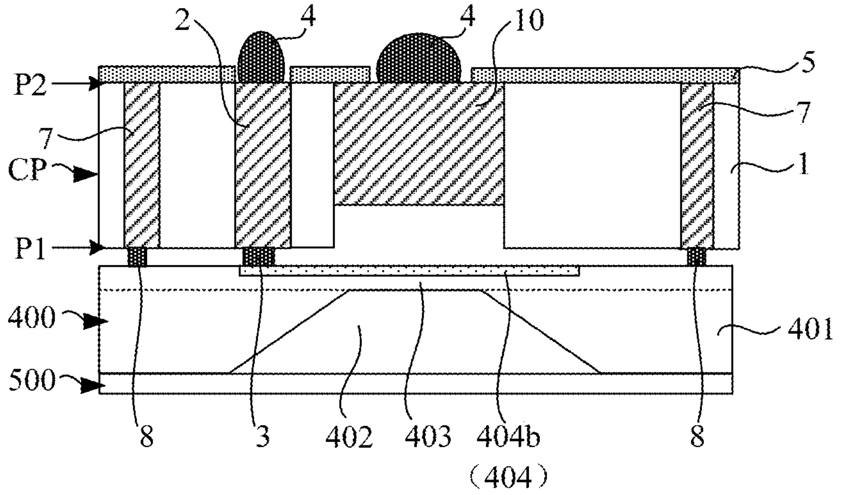
FIG. 24 is another schematic diagram of a cross-section of a sensor according to some embodiments of the present disclosure.

FIG. 23 is a schematic diagram of a cross-section of a sensor according to some embodiments of the present disclosure. FIG. 24 is another schematic diagram of a cross-section of a sensor according to some embodiments of the present disclosure. As shown in FIGS. 23 and 24, in some embodiments, the MEMS chip 400 includes a pressure-sensitive chip. In this case, the sensor is a pressure-sensitive sensor.

In some embodiments, the pressure-sensitive chip 400 includes a first substrate 401, a pressure-sensitive film 403, and a functional structure for pressure detection 404. A pressure-sensitive chamber 402 is formed in the first substrate 401, the pressure-sensitive film 403 is disposed on a side of the first substrate 400 and is connected to the pressure-sensitive chamber 402, and the functional structure for pressure detection 404 is disposed on a side, away from the pressure-sensitive chamber 402, of the pressure-sensitive film 403 and is connected to the pressure-sensitive film 403.

In some embodiments, the pressure-sensitive chip further includes a second substrate 500. The second substrate 500 is secured to a surface of a side, away from the package structure, of the first substrate 400 to seal the pressure-sensitive chamber 402.

In some embodiments, the first substrate 401 is a silicon substrate, the second substrate 500 is a glass substrate, and the first substrate 400 and the second substrate 500 are bonded and fixed.

Referring to FIG. 23, in some embodiments, the pressure-sensitive chip is a piezo-resistive pressure-sensitive chip, and the functional structure 404 for pressure detection includes a piezo-resistor 404*a*.

Referring to FIG. 24, in some embodiments, the pressure-sensitive chip is a capacitive pressure-sensitive chip, and the functional structure 404 for pressure detection includes a capacitor plate 404*b*. The capacitor plate 404*b* and the second conductive post 10 in the package cover CP form a detection capacitance.

Figure 25:
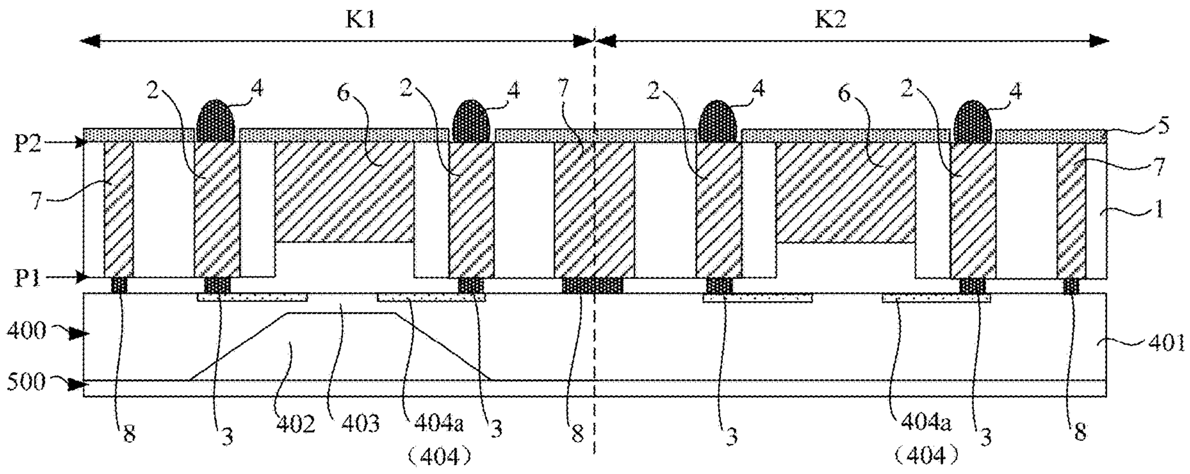
FIG. 25 is a schematic diagram of yet another cross-section of a sensor according to some embodiments of the present disclosure.
Figure 26:
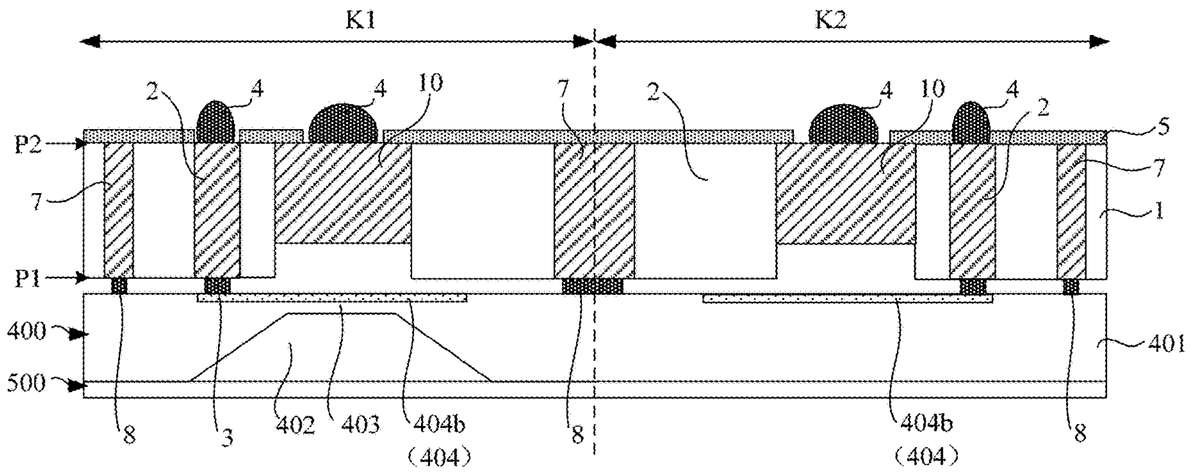
FIG. 26 is a schematic diagram of yet still another cross-section of a sensor according to some embodiments of the present disclosure.

FIG. 25 is a schematic diagram of yet another cross-section of a sensor according to some embodiments of the present disclosure. FIG. 26 is a schematic diagram of yet still another cross-section of a sensor according to some embodiments of the present disclosure. As shown in FIGS. 25 and 26, in some embodiments, the first substrate 400 is divided into a pressure detection region K1 and a pressure reference region K2. At this point, the corresponding package structure is shown in FIGS. 10 and 12. The pressure detection region K1 and the pressure reference region K2 correspond to the package region Q1 and the package region Q2 in FIG. 10/FIG. 12, respectively.

The pressure-sensitive chamber 402, the pressure-sensitive film 403, and the functional structure for pressure detection 404 are formed in the pressure detection region K1; and the functional structure for pressure detection 404 is formed in the pressure reference region K2 and the pressure-sensitive chamber 402 and the pressure-sensitive film 403 are not formed.

The component disposed in the pressure detection region K1 is capable of actually sensing and measuring the pressure and converting the pressure into an electrical signal for output, and the output electrical signal is monotonically related to the magnitude of the pressure. The component disposed in the pressure reference region K2 has a signal output that is equal to a signal output when the component in the pressure detection region K1 is not subjected to external pressure and does not vary with changes in external pressure. In practice, by comparing the signal output from the component in the pressure detection region K1 with the signal output from the component in the pressure reference region K2 (e.g., differential processing of the signals), and the magnitude of the corresponding pressure is determined based on the difference of the signals. In this way, the undesirable effects, such as the noise output from the pressure sensor, zero drift, temperature drift, and the like, are reduced, and thus the overall performance of the pressure sensor is improved.

It should be understood that the above embodiments are merely exemplary embodiments to illustrate the principles of the present disclosure. However, the present disclosure is not limited thereto. For those skilled in the art, various variations and improvements may be made without departing from the spirit and substance of the present disclosure, which are also regarded as the scope of protection of the present disclosure.

The invention claimed is:

1. A package structure applied to an MEMS chip, comprising:

an insulating dielectric layer having a first surface and a second surface that are opposite to each other, wherein at least one first accommodation space running from the first surface to the second surface is formed in the insulating dielectric layer; and at least one conductive post in one-to-one correspondence with the at least one first accommodation space, wherein the conductive post is disposed within the corresponding first accommodation space, a material of the conductive post comprises a non-metallic conductive material, and an absolute value of a difference between a thermal expansion coefficient of the conductive post and a thermal expansion coefficient of the insulating dielectric layer is less than or equal to $8\times10^{-6}/^{\circ}$ C.;

wherein the at least one conductive post comprises at least one first conductive post, two end faces of the first conductive post are flush with the first surface and the second surface, respectively.

2. The package structure according to claim 1, wherein the at least one conductive post further comprises a second conductive post; wherein one end face of the second conductive post is flush with the second surface; and the other end face of the second conductive post is flush with the first surface, or the other end face of the second conductive post is disposed between a plane in which the first surface is disposed and a plane in which the second surface is disposed.

3. The package structure according to claim 1, wherein at least one second accommodation space running from the first surface to the second surface is formed in the insulating dielectric layer; and the package structure further comprises a filling post, wherein the filling post is disposed in the corresponding second accommodation space, one end face of the filling post is flush with the second surface, and the other end face of the filling post is disposed between a plane in which the first surface is disposed and a plane in which the second surface is disposed.

4. The package structure according to claim 3, wherein a material of the filling post is the same as the material of the conductive post.

5. The package structure according to claim 1, further comprising:

at least one seal ring disposed on a side of the first surface, wherein an orthographic projection of the conductive post on the first surface is within a region enclosed by an orthographic projection of the corresponding seal ring on the first surface.

6. The package structure according to claim 5, wherein the first conductive post is configured with a corresponding first conductive connection terminal; wherein the first conductive connection terminal being connected to an end face, flush with the first surface, of the corresponding first conductive post; and a thickness of the first conductive connection terminal in a direction perpendicular to the first surface is equal to a thickness of the seal ring in the direction perpendicular to the first surface.

7. The package structure according to claim 6, wherein the first conductive connection terminal and the seal ring are disposed in a same layer and made of a same material.

8. The package structure according to claim 5, wherein a number of the seal rings is two, and the two seal rings are connected to each other at sides close to each other.

9. The package structure according to claim 5, wherein at least one third accommodation space in one-to-one correspondence with the seal rings is formed in the insulating dielectric layer, the third accommodation space being communicated to the first surface;

wherein a connection post is provided in the third accommodation space, wherein one end face of the connection post is flush with the first surface, and the end face, flush with the first surface, of the connection post is in contact with the corresponding seal ring.

10. The package structure according to claim 9, wherein the third accommodation space is further communicated to the second surface, and the other end face of the connection post is flush with the second surface.

11. The package structure according to claim 9, wherein a material of the connection post is the same as the material of the conductive post.

12. The package structure according to claim 1, further comprising: a protective layer 5, disposed on a side of the second surface, wherein at least one via corresponding to the conductive post is formed in the protective layer, the via being communicated to an end face, flush with the second plane, of the conductive post.

13. The package structure according to claim 12, wherein the conductive post is configured with a corresponding second conductive connection terminal; wherein the second conductive connection terminal is disposed within the via corresponding to the corresponding conductive post, and the second conductive connection terminal is connected to the end face, flush with the second surface, of the corresponding conductive post; and a thickness of the second conductive connection terminal in a direction perpendicular to the second surface is greater than a thickness of the protective layer in the direction perpendicular to the second surface.

14. The package structure according to claim 1, wherein a material of the insulating dielectric layer comprises glass; and a material of the conductive post comprises silicon.

15. A sensor, comprising: an MEMS chip and a package structure configured to package the MEMS chip, wherein the package structure is applied to an MEMS chip, and the package structure comprises:

an insulating dielectric layer having a first surface and a second surface that are opposite to each other, wherein at least one first accommodation space running from the first surface to the second surface is formed in the insulating dielectric layer; and at least one conductive post in one-to-one correspondence with the at least one first accommodation space, wherein the conductive post is disposed within the corresponding first accommodation space, a material of the conductive post comprises a non-metallic conductive material, and an absolute value of a difference between a thermal expansion coefficient of the conductive post and a thermal expansion coefficient of the insulating dielectric layer is less than or equal to $8\times10^{-6}$/° C.;

wherein the at least one conductive post comprises at least one first conductive post, two end faces of the first conductive post are flush with the first surface and the second surface, respectively.

16. The sensor according to claim 15, wherein the MEMS chip comprises a pressure-sensitive chip.

17. The sensor according to claim 16, wherein the pressure-sensitive chip comprises:

a first substrate, wherein a pressure-sensitive chamber is formed in the first substrate;

a pressure-sensitive film disposed on a side of the first substrate and connected to the pressure-sensitive chamber; and a functional structure for pressure detection, disposed on a side, away from the pressure-sensitive chamber, of the pressure-sensitive film and connected to the pressure-sensitive film.

18. The sensor according to claim 17, wherein the first substrate is divided into a pressure detection region and a pressure reference region; wherein the pressure-sensitive chamber, the pressure-sensitive film, and the functional structure for pressure detection are formed in the pressure detection region; and the functional structure for pressure detection is formed in the pressure reference region and the pressure-sensitive chamber and the pressure-sensitive film are not formed in the pressure reference region.

19. The sensor according to claim 17, wherein the functional structure for pressure detection comprises: a piezoresistor or a capacitor plate.

20. The sensor according to claim 15, wherein the at least one conductive post further comprises a second conductive post; wherein one end face of the second conductive post is flush with the second surface; and the other end face of the second conductive post is flush with the first surface, or the other end face of the second conductive post is disposed between a plane in which the first surface is disposed and a plane in which the second surface is disposed.

* * * * *